United States Patent
Yasuda et al.

(10) Patent No.: US 11,069,557 B2
(45) Date of Patent: Jul. 20, 2021

(54) METHOD FOR PRODUCING THIN WAFER

(71) Applicant: Shin-Etsu Chemical Co., Ltd., Tokyo (JP)

(72) Inventors: Hiroyuki Yasuda, Annaka (JP); Michihiro Sugo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 16/553,503

(22) Filed: Aug. 28, 2019

(65) Prior Publication Data

US 2020/0075388 A1   Mar. 5, 2020

(30) Foreign Application Priority Data

Sep. 3, 2018 (JP) .............................. JP2018-164373

(51) Int. Cl.
*B32B 43/00* (2006.01)
*H01L 21/683* (2006.01)
*C09J 147/00* (2006.01)
*B32B 38/10* (2006.01)

(52) U.S. Cl.
CPC ........ *H01L 21/6836* (2013.01); *B32B 43/006* (2013.01); *C09J 147/00* (2013.01); *B32B 38/10* (2013.01); *B32B 2457/14* (2013.01); *H01L 2221/68386* (2013.01)

(58) Field of Classification Search
CPC . B32B 38/10; B32B 43/006; Y10T 156/1153; Y10T 156/1917
See application file for complete search history.

(56) References Cited

U.S. PATENT DOCUMENTS

| | | |
|---|---|---|
| 2016/0326414 A1 | 11/2016 | Tagami et al. |
| 2017/0110360 A1 | 4/2017 | Tagami et al. |
| 2017/0154801 A1* | 6/2017 | Tagami .................. C09J 183/04 |
| 2017/0198176 A1 | 7/2017 | Kamochi et al. |
| 2017/0352637 A1 | 12/2017 | Yasuda et al. |
| 2018/0102333 A1* | 4/2018 | Yasuda ................... B32B 27/26 |
| 2018/0102334 A1* | 4/2018 | Yasuda ................... H01L 24/03 |

FOREIGN PATENT DOCUMENTS

| | | |
|---|---|---|
| JP | 2003-177528 A | 6/2003 |
| JP | 2013-534721 A | 9/2013 |
| WO | 2015/072418 A1 | 5/2015 |

OTHER PUBLICATIONS

Extended European Search Report dated Feb. 7, 2020, issued in counterpart EP Application No. 19192280.6. (10 pages).

* cited by examiner

*Primary Examiner* — Mark A Osele
*Assistant Examiner* — Nickolas R Harm
(74) *Attorney, Agent, or Firm* — Westerman, Hattori, Daniels & Adrian, LLP

(57) ABSTRACT

A method for producing a thin wafer includes: separating the support body from the laminate by irradiating a wafer laminate, which includes a support body, an adhesive layer formed on the support body, and a wafer laminated with a surface thereof including a circuit plane facing the adhesive layer, with light from a side of the support body of the wafer laminate; and after separating, removing a resin layer remaining on the wafer from the wafer by peeling, wherein the adhesive layer includes only a resin layer A with a light-blocking property, and a resin layer B including a thermosetting silicone resin or a non-silicone thermoplastic resin in this order from the side of the support body.

9 Claims, 1 Drawing Sheet

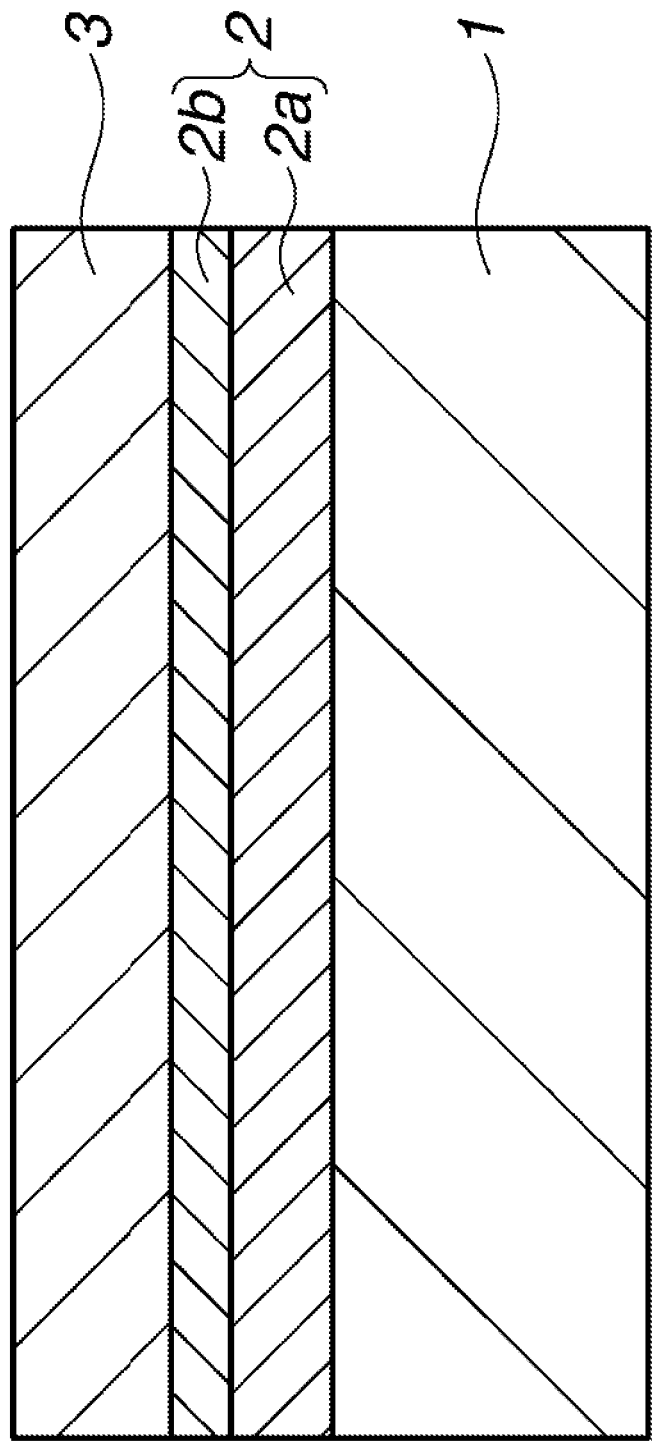

METHOD FOR PRODUCING THIN WAFER

CROSS-REFERENCE TO RELATED APPLICATION

This non-provisional application claims priority under 35 U.S.C. § 119(a) on Patent Application No. 2018-164373 filed in Japan on Sep. 3, 2018, the entire contents of which are hereby incorporated by reference.

TECHNICAL FIELD

The present invention relates to a method for producing a thin wafer.

BACKGROUND ART

Three-dimensional semiconductor packaging has become essential in achieving higher density and higher capacity. The three-dimensional packaging technique is a semiconductor producing technique in which semiconductor chips, each being thinned, are connected through silicon penetration electrodes (through silicon via, TSV) and stacked on each other. This technique requires a step of thinning a substrate including a semiconductor circuit by grinding a surface where a circuit is not formed (also referred to as "back surface") and forming an electrode including TSV on the back surface. Conventionally, in a back surface grinding step for a silicon substrate, the surface opposite to the surface to be ground is provided with a back surface protection tape so that the wafer is not damaged during the grinding. However, this tape includes an organic resin film as a support base material, which is advantageous in flexibility but disadvantageous in insufficient strength and heat resistance; therefore, this tape is not suitable in a TSV forming step or a wiring layer forming step on the back surface.

In view of the above, a system has been suggested in which the semiconductor substrate is bonded to a support body formed of silicon, glass, or the like with an adhesive layer interposed therebetween. Thus, the substrate can resist in the step grinding the back surface or forming the TSV or the back surface electrode. The important point here is the adhesive layer used to bond the substrate to the support body. The adhesive layer needs to be durable enough to bond the substrate to the support body densely and to resist in the subsequent steps, and to enable the thin wafer to be separated easily from the support body in the end. Since the adhesive layer is separated in the end, this adhesive layer is herein also referred to as a temporary adhesive layer.

As the known temporary adhesive layers and its separating methods, a technique in which bonding and separating are performed in a thermally fused state by the use of a hot-melt hydrocarbon compound as the adhesive has been suggested (Patent Document 1). This technique is simple because the control is performed only by the heating; however, the applicable range is narrow because the thermal stability at high temperature over 200° C. is insufficient.

Another technique of using a silicone sticky agent as the temporary adhesive layer has been suggested (Patent Document 2). In this technique, an addition curable type silicone sticky agent is used to bond the substrate to the support body and in the separation, the substrate is immersed in a chemical that dissolves or decomposes the silicone resin so that the substrate is separated from the support body. Therefore, it takes a long time to separate the substrate and thus, it has been difficult to apply this technique to the actual producing process.

On the other hand, another technique has also been suggested in which an adhesive including a light absorbing substance is irradiated with light with high intensity to decompose the adhesive layer, so that the adhesive layer is separated from the support body (Patent Document 3). This method is advantageous in that it takes shorter time to process each substrate in separating the substrate from the support body; however, since a metal compound needs to be used to convert the delivered light into heat, metal contamination may occur. In addition, when the adhesive layer remaining on the substrate is removed by a solvent, the adhesive that has been decomposed is insoluble in the solvent and therefore the remaining adhesive may adhere to the substrate again to result in contamination.

CITATION LIST

Patent Document 1: JP-A 2003-177528
Patent Document 2: WO 2015/072418
Patent Document 3: JP-A 2013-534721

SUMMARY OF THE INVENTION

The present invention has been made in view of the above problem, and it is an object of the present invention to provide a method for producing a thin wafer that can easily separate a wafer from a support body, remove resin without contaminating the wafer, and increase the productivity of a thin wafer.

As a result of earnest researches for achieving the object, the present inventors have found out the above object can be achieved in a manner that: a wafer laminate is formed by bonding a support body and a wafer with a predetermined adhesive layer, the support body is separated from the wafer laminate, and then the remaining adhesive layer is removed by peeling. Thus, the present invention has been completed.

Therefore, the present invention provides the following method for producing a thin wafer.

1. A method for producing a thin wafer, including separating a support body from a wafer laminate by irradiating the wafer laminate with light from the side of the support body of the wafer laminate; and after the separating, removing a resin layer remaining on the wafer from the wafer by peeling; wherein the wafer laminate includes a support body, an adhesive layer formed on the support body, and a wafer stacked with a surface thereof including a circuit plane facing the adhesive layer; and the adhesive layer includes only a resin layer A with a light-blocking property, and a resin layer B including a thermosetting silicone resin or a non-silicone thermoplastic resin in this order from the side of the support body.
2. The method for producing a thin wafer according to 1, wherein the laminate is exposed to a temperature of 30 to 60° C. when the resin layer B is separated by peeling from the wafer.
3. The method for producing a thin wafer according to 1 or 2, wherein the resin layer A with a light-blocking property has a transmissivity of 20% or less at a wavelength of 355 nm and an absorption maximum wavelength of 300 to 500 nm.
4. The method for producing a thin wafer according to any one of 1 to 3, wherein the resin layer A includes a hardened product of a resin composition A containing a resin A including a repeating unit represented by the following formula (1):

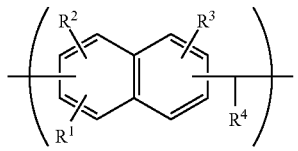

(1)

wherein $R^1$ to $R^3$ independently represent a hydrogen atom, a hydroxy group, or a monovalent organic group of 1 to 20 carbon atoms, at least one of $R^1$ to $R^3$ is a hydroxy group, and $R^4$ represents a hydrogen atom or a monovalent organic group of 1 to 30 carbon atoms that may have a substituent.

5. The method for producing a thin wafer according to 4, wherein the resin composition A further includes a cross-linker.

6. The method for producing a thin wafer according to 4 or 5, wherein the resin composition A further includes an acid generator.

7. The method for producing a thin wafer according to any one of 4 to 6, wherein the resin composition A further includes an organic solvent.

8. The method for producing a thin wafer according to any one of 1 to 7, wherein the resin layer A has a thickness of 0.1 to 50 μm.

9. The method for producing a thin wafer according to any one of 1 to 8, wherein the resin layer B includes a resin including a siloxane skeleton and an epoxy group, and the resin including the siloxane skeleton and the epoxy group includes a repeating unit represented by the following formula (2) and optionally a repeating unit represented by the following formula (3):

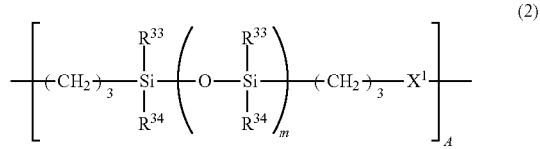

(2)

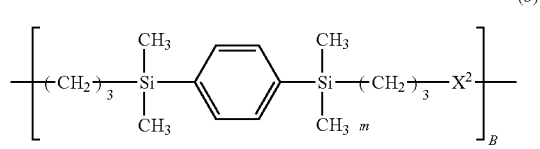

(3)

wherein $R^{31}$ to $R^{34}$ independently represent a monovalent hydrocarbon group of 1 to 8 carbon atoms, m represents an integer of 1 to 100, A and B are numbers satisfying $0<A\leq1$, $0\leq B<1$, and $A+B=1$, and $X^1$ and $X^2$ each represent a bivalent organic group represented by the following formula (4):

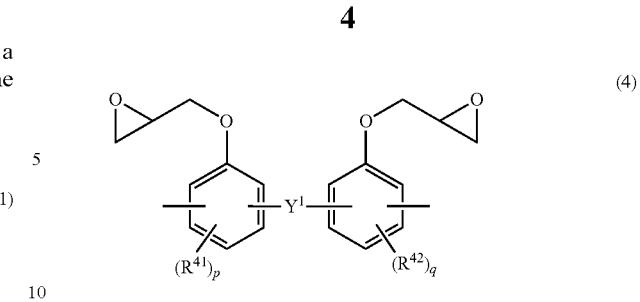

(4)

wherein $Y^1$ represents a single bond, a methylene group, a propane-2,2-diyl group, a 1,1,1,3,3,3-hexafluoropropane-2,2-diyl group or a fluorene-9,9-diyl group, $R^{41}$ and $R^{42}$ independently represent an alkyl group or an alkoxy group of 1 to 4 carbon atoms, and p and q independently represent 0, 1, or 2.

10. The method for producing a thin wafer according to any one of 1 to 8, wherein the resin layer B includes a non-silicone thermoplastic resin, and the non-silicone thermoplastic resin is at least one kind selected from the group consisting of polyolefin base thermoplastic elastomer, polybutadiene base thermoplastic elastomer, polystyrene base thermoplastic elastomer, polystyrene-butadiene base thermoplastic elastomer, polystyrene-olefin base thermoplastic elastomer, and those elastomers that have been hydrogenated.

ADVANTAGEOUS EFFECTS OF THE INVENTION

According to the present invention, the wafer can be separated from the support body easily, the resin can be removed without contaminating the wafer, and the productivity of the thin wafer can be increased.

BRIEF DESCRIPTION OF THE DRAWINGS

FIG. 1 is a schematic view illustrating a wafer laminate.

DESCRIPTION OF THE PREFERRED EMBODIMENT

A method for producing a thin wafer according to the present invention includes: separating a support body from a wafer laminate by irradiating the wafer laminate, which includes a support body, an adhesive layer formed on the support body, and a wafer laminated with a surface thereof including a circuit plane facing the adhesive layer, with light from a support body side of the wafer laminate; and removing a resin layer remaining on the wafer from the wafer by peeling.

A structure of the wafer laminate is specifically described. For example, as illustrated in FIG. 1, a support body 1 and a wafer 3 are bonded together with an adhesive layer 2. The adhesive layer 2 includes two layers: a resin layer 2a (resin layer A) formed in contact with the support body 1 and a resin layer 2b (resin layer B) formed in contact with the resin layer 2a. In the present invention, after the support body is separated from the wafer laminate, the resin layer 2b is removed from the laminate by peeling.

Support Body

The support body may be a transparent substrate, a silicon wafer, a ceramic substrate, or the like, and is preferably a transparent substrate in the transmissivity of a laser to be delivered in separating the support body. The transparent substrate is usually a glass substrate or a quartz substrate with a thickness of preferably 300 to 1,000 μm usually, more preferably 500 to 800 μm.

Wafer

The wafer is generally a semiconductor wafer. Examples of the semiconductor wafer include a silicon wafer, a germanium wafer, a gallium-arsenic wafer, a gallium-phosphorus wafer, a gallium-arsenic-aluminum wafer, or the like. The thickness of the wafer is not limited to a particular thickness, and is preferably 600 to 800 μm usually, more preferably 625 to 775 μm.

Adhesive Layer

The adhesive layer includes only the resin layer A with a light-blocking property, and the resin layer B including a thermosetting silicone resin or a non-silicone thermoplastic resin. In the wafer laminate, the resin layer A and the resin layer B are formed in the order from the support body side.

Resin Layer A

The resin layer A is the resin layer with a light-blocking property (light-blocking layer) whose light transmissivity at a wavelength of 355 nm is preferably 20% or less, more preferably 18% or less, and much more preferably 15% or less. The resin layer A has an absorption maximum wavelength of preferably 300 to 500 nm, and more preferably 300 to 400 nm. In addition, the resin layer A preferably has a light transmissivity of 20% or less at a wavelength of 300 to 500 nm.

The resin A included in the resin layer A preferably contains a resin with a condensed ring in a main chain from the aspects of the heat resistance, the adhesion, the chemical resistance, and the like. The resin A preferably includes a repeating unit represented by the following formula (1). As the repeating unit represented in formula (1), only one kind may be included, or two or more kinds may be included.

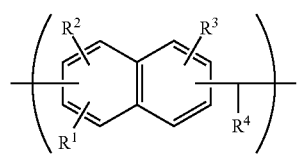

(1)

In formula (1), $R^1$ to $R^3$ independently represent a hydrogen atom, a hydroxy group, or a monovalent organic group of 1 to 20 carbon atoms, preferably 1 to 10 atoms, provided that at least one of $R^1$ to $R^3$ is a hydroxy group.

Examples of the monovalent organic group include: linear, branched, or cyclic alkyl groups of 1 to 20 carbon atoms, such as a methyl group, an ethyl group, an n-propyl group, an isopropyl group, an n-butyl group, a sec-butyl group, a tert-butyl group, an n-pentyl group, a neopentyl group, an n-hexyl group, an n-heptyl group, an n-octyl group, an n-nonyl group, an n-decyl group, an n-dodecyl group, an n-pentadecyl group, an n-icosyl group, a cyclopentyl group, a cyclohexyl group, a cyclopentylmethyl group, a cyclohexylmethyl group, a cyclopentylethyl group, a cyclohexylethyl group, a cyclopentylbutyl group, a cyclohexylbutyl group, and an adamantyl group; linear, branched, or cyclic alkoxy groups of 1 to 5 carbon atoms, such as a methoxy group; epoxy group containing groups such as a glycidyloxy group; and aryl groups such as a phenyl group and a naphthyl group. $R^1$ to $R^3$ are preferably a hydrogen atom, a hydroxy group, a methyl group, or the like.

In formula (1), $R^4$ is a hydrogen atom or a monovalent organic group of 1 to 30 carbon atoms, preferably 1 to 10 carbon atoms that may include a substituent. Examples of the monovalent organic group represented by $R^4$ include linear, branched, or cyclic alkyl groups, aryl groups such as a phenyl group, a naphthyl group, and an anthracenyl group, and a monovalent polycyclic saturated hydrocarbon group such as a norbomyl group. A part of these hydrogen atoms may be substituted by an alkyl group, an aryl group, an aldehyde group, a halogen atom, a nitro group, a nitrile group, a hydroxy group, or the like.

The resin A can be obtained usually in a manner that, using acid or a base as a catalyst in the presence or absence of a solvent, naphthol or its derivative and an aldehyded compound are subjected to a polycondensation reaction at room temperature or, if necessary, in a cooled or heated state.

Examples of the naphthol or its derivative include 1-naphthol, 2-naphthol, 2-methyl-1-naphthol, 4-methoxy-1-naphthol, 7-methoxy-2-naphthol, 1,2-dihydroxynaphthalene, 1,3-dihydroxynaphthalene, 2,3-dihydroxynaphthalene, 1,4-dihydroxynaphthalene, 1,5-dihydroxynaphthalene, 1,6-dihydroxynaphthalene, 2,6-dihydroxynaphthalene, 1,7-dihydroxynaphthalene, 2,7-dihydroxynaphthalene, 1,8-dihydroxynaphthalene, 5-amino-1-naphthol, 2-methoxycarbonyl-1-naphthol, 1-(4-hydroxyphenyl)naphthalene, 6-(4-hydroxyphenyl)-2-naphthol, 6-(cyclohexyl)-2-naphthol, 1,1'-bi-2-naphthol, 6,6'-bi-2-naphthol, 9,9-bis(6-hydroxy-2-naphthyl)fluorene, 6-hydroxy-2-vinylnaphthalene, 1-hydroxymethylnaphthalene, and 2-hydroxymethylnaphthalene. Any one of the naphthols or their derivatives described above can be used alone or two or more kinds thereof can be used in combination.

One example of the aldehyde compound is shown below.

$R^4$—CHO

In the formula, $R^4$ is the same as that described above.

Examples of the aldehyde compound include formaldehyde, trioxane, paraformaldehyde, acetoaldehyde, propylaldehyde, adamantanecarboaldehyde, benzaldehyde, phenylacetoaldehyde, α-phenylpropylaldehyde, β-phenylpropylaldehyde, o-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, m-methylbenzaldehyde, p-methylbenzaldehyde, p-ethylbenzaldehyde, p-n-butylbenzaldehyde, 1-naphthylaldehyde, 2-naphthylaldehyde, anthracenecarboaldehyde, pyrenecarboaldehyde, furfural, methylal, phthalaldehyde, isophthalaldehyde, terephthalaldehyde, naphthalenedicarboaldehyde, anthracenedicarboaldehyde, and pyrenedicarboaldehyde. Any one of the aldehyde compounds described above can be used alone or two or more kinds thereof can be used in combination.

Examples of the solvent that is used in the polycondensation reaction include: alcohols such as methanol, ethanol, isopropylalcohol, butanol, ethylene glycol, propylene glycol, diethylene glycol, glycerol, methyl cellosolve, ethyl cellosolve, butyl cellosolve, and propylene glycol monomethyl ether; ethers such as diethyl ether, dibutyl ether, diethylene glycol diethyl ether, diethylene glycol dimethyl ether, tetrahydrofurane (THF), and 1,4-dioxane; chlorine solvents such as methylene chloride, chloroform, dichloroethane, and trichloroethylene; hydrocarbons such as hexane, heptane, benzene, toluene, xylene, and cumene; nitriles such as acetonitrile; ketones such as acetone, ethyl methyl ketone, and isobutyl methyl ketone; esters such as ethyl acetate, n-butyl acetate, and propylene glycol methyl ether acetate; lactones such as γ-butyrolactone; and non-proton polar solvents such as dimethylsulfoxide, N,N-dimethylformamide, and hexamethylphosphoric triamide. Any one of the solvents described above can be used alone or two or more kinds thereof can be used in combination. Any of these solvents can be used by preferably 0 to 2,000 parts by weight, more preferably 10 to 2,000 parts by weight, per a total of 100 parts by weight of naphthol or its derivative and the aldehyde compound.

Examples of the acid catalyst that is used in the polycondensation reaction include: inorganic acids such as chloric acid, hydrobromic acid, sulfuric acid, nitric acid, phosphoric acid, and heteropolyacid; organic acids such as oxalic acid, trifluoroacetic acid, methane sulfonic acid, benzene sulfonic acid, p-toluene sulfonic acid, and trifluoromethane sulfonic acid; and Lewis acids such as aluminum trichloride, aluminum ethoxide, aluminum isopropoxide, boron trifluoride, boron trichloride, boron tribromide, tin tetrachloride, tin tetrabromide, dibutyltin dichloride, dibutyltin dimethoxide, dibutyltin oxide, titanium tetrachloride, titanium tetrabromide, titanium (IV) methoxide, titanium (IV) ethoxide, titanium (IV) isopropoxide, and titanium oxide (IV).

Examples of the base catalyst that is used in the polycondensation reaction include: inorganic bases such as sodium hydroxide, potassium hydroxide, barium hydroxide, sodium carbonate, sodium bicarbonate, potassium carbonate, lithium hydride, sodium hydride, potassium hydride, and calcium hydride; alkyl metals such as methyl lithium, n-butyl lithium, methyl magnesium chloride, and ethyl magnesium bromide; alkoxides such as sodium methoxide, sodium ethoxide, and potassium tert-butoxide; and organic bases such as triethyl amine, diisopropyl ethyl amine, N,N-dimethylaniline, pyridine, and 4-dimethylaminopyridine.

The catalyst is used by preferably 0.001 to 100 parts by weight, more preferably 0.005 to 50 parts by weight per a total of 100 parts by weight of naphthol or its derivative and the aldehyde compound. The reaction temperature is preferably in the range of −50° C. to the boiling temperature of the solvent, more preferably from room temperature to 100° C.

Examples of the polycondensation reaction method include a method of collectively preparing naphthol or its derivative, the aldehyde compound, and the catalyst, and a method of dropping naphthol or its derivative, and the aldehyde compound in the presence of the catalyst.

Regarding the use rate of the naphthol or its derivative, and the aldehyde compound, the aldehyde compound is used by preferably 0.01 to 5 in molar ratio, more preferably 0.05 to 2, much more preferably 0.05 to 1, and the most preferably 0.1 to 0.9, per the total of the naphthol or its derivative.

In order to remove the unreacted raw material, the catalyst, and the like remaining in the system after the polycondensation reaction, the temperature of a reaction tank may be increased to 130 to 230° C. and the evaporated substance is removed at about 1 to 50 mmHg, the polymer may be fractionated by adding appropriate solvent or water, or the polymer may be dissolved in a good solvent and deposited again in a poor solvent. These methods can be selected depending on the property of the reaction product that is obtained.

The weight-average molecular weight (Mw) of the resin A is preferably 500 to 500,000, more preferably 1,000 to 100,000. The degree of dispersion of the polymer is preferably in the range of 1.2 to 20; if the monomer component, the oligomer component, or the low-molecular weight component with an Mw of less than 500 is cut, the evaporation component during the baking can be suppressed and the contamination around a baking cup or the occurrence of a defect on the surface due to the dropping of the evaporation component can be prevented. In the present invention, Mw is the measurement value in terms of polystyrene obtained by gel permeation chromatography (GPC) using THF as the solvent.

The resin layer A is preferably formed of a hardened product of a resin composition A containing the resin A. The resin composition A preferably includes a crosslinker that crosslinks the resin A through thermal reaction. The crosslinker is preferably an epoxy compound with two or more functional groups in a molecule, or epoxy resin, or amino resin such as methylol melamine, for example, and a catalyst is preferably added further in order to accelerate the crosslinking reaction between the crosslinker and the polymer.

The epoxy compound and the epoxy resin may be, for example, bifunctional, trifunctional, tetra- or more functional group, such as EOCN-1020 (see the following formula), EOCN-102S, XD-1000, NC-2000-L, EPPN-201, GAN, NC6000 (Nippon Kayaku Co., Ltd.), or the substances represented by the following formulae.

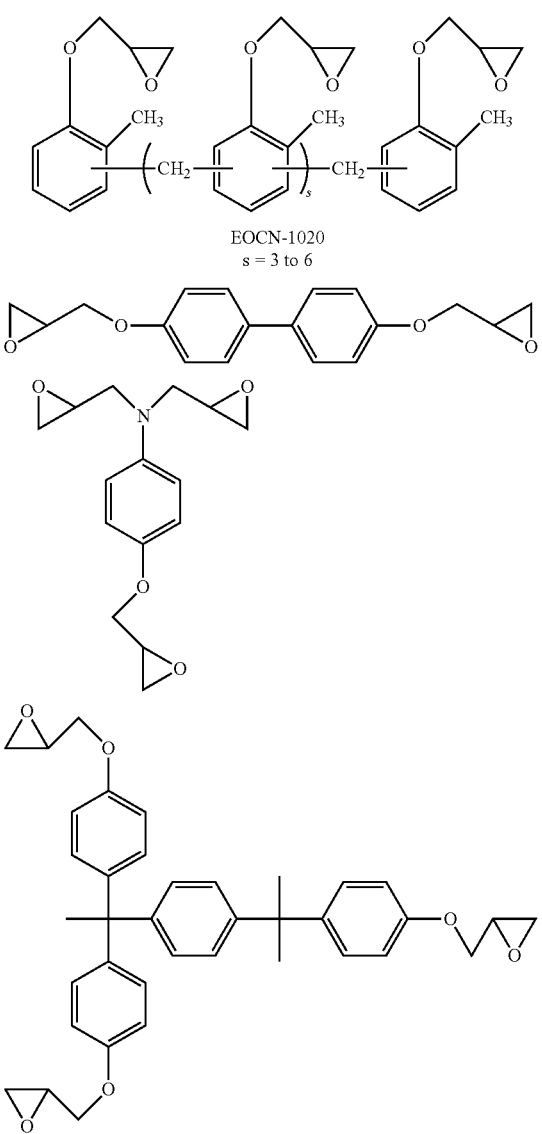

EOCN-1020
s = 3 to 6

-continued

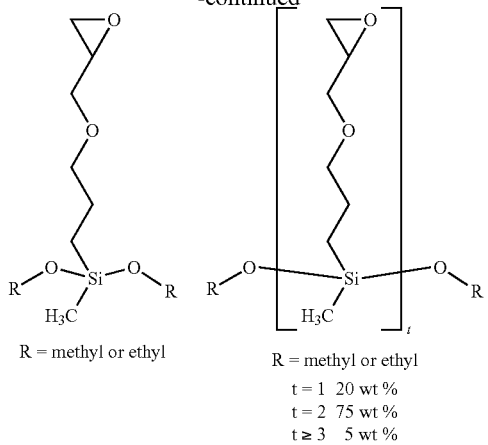

R = methyl or ethyl

R = methyl or ethyl
t = 1  20 wt %
t = 2  75 wt %
t ≥ 3  5 wt %

In the case of using the epoxy compound or the epoxy resin as the crosslinker, the mixing amount thereof is preferably 0.1 to 50 parts by weight, more preferably 0.1 to 30 parts by weight, and much more preferably 1 to 30 parts by weight per 100 parts by weight of the polymer including a repeating unit represented by formula (1). Any of the crosslinkers may be used alone or two or more kinds thereof may be used in combination. If the mixing amount is in the range described above, the sufficient crosslinking density is achieved and the obtained hardened product functions properly.

In the case of using the epoxy resin as the crosslinker, it is preferable to add a hardening accelerator as the catalyst. By the use of the epoxy resin hardening accelerator, the hardening reaction can be advanced properly and uniformly.

Examples of the epoxy resin hardening accelerator include imidazole compounds such as 2-methyl imidazole, 2-ethyl imidazole, 2-ethyl-4-methyl imidazole, an ethyl isocyanate compound of these compounds, 2-phenyl imidazole, 2-phenyl-4-methyl imidazole, 2-phenyl-4-methyl-5-hydroxymethyl imidazole, and 2-phenyl-4,5-dihydroxymethyl imidazole; DBU compounds such as 1,8-diazabicyclo[5.4.0]undecene-7 (DBU), 1,5-diazabicyclo[4.3.0]nonene-5 (DBN), organic acid salts of DBU, a phenolic resin salt of DBU, and a tetraphenylborate salt of a DBU derivative; triorganophosphines such as triphenyl phosphine, tributyl phosphine, tris(p-methylphenyl)phosphine, tris(p-methoxyphenyl)phosphine, tris(p-ethoxyphenyl)phosphine, triphenylphosphine-biphenylborate, and tetraphenylphosphine-tetraphenylborate; and quaternary phosphonium salt, tertiary amines such as triethylene ammonium-triphenylborate, and tetraphenylboric acid salt thereof. Any of these epoxy resin hardening accelerators may be used alone, or two or more kinds may be used in combination.

The epoxy resin hardening accelerator is contained by preferably 0.1 to 10 parts by weight, more preferably 0.2 to 5 parts by weight per 100 parts by weight of the resin A.

As the amino resin such as methylol melamine used in the present invention, one or more kinds of components selected from the group consisting of formalin or formalin-alcohol modified amino condensates and phenol compounds including two or more methylol groups or alkoxy methylol groups on the average in one molecule can be used.

The amino resin has an Mw of preferably 150 to 10,000, more preferably 200 to 3,000. If the Mw is in the above range, enough hardness is obtained and the hardened composition has high heat resistance.

Examples of the formalin or formalin-alcohol modified amino condensate include a formalin or formalin-alcohol modified melamine condensate and a formalin or formalin-alcohol modified urea condensate.

The formalin or formalin-alcohol modified melamine condensate can be prepared by modifying a melamine monomer with formalin into methylol in accordance with a known method or modifying this product further into alkoxy with alcohol to produce a modified melamine represented by the following formula. Examples of the alcohol include lower alcohols such as alcohols of 1 to 4 carbon atoms.

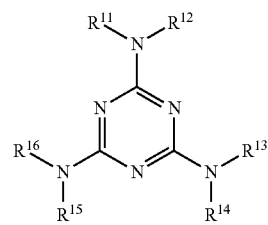

In the formula, $R^{11}$ to $R^{16}$ independently represent a methylol group, a linear, branched, or cyclic alkoxymethyl group including an alkoxy group of 1 to 4 carbon atoms, or a hydrogen atom, and at least one of $R^{11}$ to $R^{16}$ is a methylol group or an alkoxymethyl group.

Examples of the modified melamine include trimethoxy methyl monomethylol melamine, dimethoxy methyl monomethylol melamine, trimethylol melamine, hexamethylol melamine, and hexamethoxy methylol melamine. Next, the modified melamine or a multimer resulting from the modified melamine (for example, oligomer such as dimer or timer) and formaldehyde are subjected to addition condensation polymerization in accordance with a normal method until a desired molecular weight is achieved; thus, the formalin or formalin-alcohol modified melamine condensate can be obtained. Note that the modified melamine and one or more kinds of modified melamine condensate corresponding to a condensate of the modified melamine can be used as the crosslinker.

The formalin or formalin-alcohol modified urea condensate can be prepared by modifying a urea condensate having a desired molecular weight with formalin into methylol in accordance with a known method or modifying this product further into alkoxy with alcohol.

Specific examples of the modified urea condensate include a methoxy methylate urea condensate, an ethoxy methylate urea condensate, and a propoxy methylate urea condensate. One or more kinds of these modified urea condensates can be used.

Among these, the phenol compound including two or more methylol groups or alkoxy methylol groups on the average in one molecule is, for example, (2-hydroxy-5-methyl)-1,3-benzenedimethanol or 2,2',6,6'-tetramethoxymethylbisphenol A.

Any of these amino condensates and phenol compounds can be used alone, or two or more kinds thereof can be used in combination.

The crosslinker is contained by preferably 0.1 to 50 parts by weight, more preferably 1 to 30 parts by weight per 100 parts by weight of the resin A. In this range, the composition A is hardened enough and the obtained hardened product functions properly.

If the amino resin such as the methylol melamine is used as the crosslinker, it is preferable to add a heat acid generator as the catalyst. This heat acid generator is not limited to a particular kind; for example, ammonium salt represented by the following formula is given.

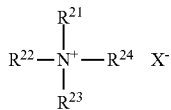

In the formula, $R^{21}$ to $R^{24}$ independently represent a hydrogen atom, a linear, branched, or cyclic alkyl group or oxoalkyl group of 1 to 12 carbon atoms, a linear, branched, or cyclic alkenyl group or oxoalkenyl group of 2 to 12 carbon atoms, an aryl group of 6 to 20 carbon atoms, or an aralkyl group or an aryloxoalkyl group of 7 to 12 carbon atoms. The hydrogen atoms of these groups may be substituted by an alkoxy group entirely or partially. Two selected from $R^{21}$ to $R^{24}$ may form a ring with a nitrogen atom bonded thereto. This ring may be an alicyclic ring of 3 to 10 carbon atoms having the nitrogen atom in the formula within the ring, or a heteroaromatic ring of 5 to 10 carbon atoms having the nitrogen atom in the formula within the ring. $X^-$ represents sulfonic acid anion with at least one of α-positions is fluorinated, perfluoroalkylimide acid anion, or perfluoroalkyl methide acid anion.

Specific examples of $X^-$ include: perfluoroalkane sulfonic acid anions such as triflate anion and nonaflate anion; sulfonate anions with at least one of α-positions fluoro-substituted; imide anions such as bis(trifluoromethylsulfonyl)imide anion, bis(perfluoroethylsulfonyl)imide anion, and bis(peffluorobutylsulfonyl)imide anion; and methanide anions such as tris(trifluoromethylsulfonyl)methanide anion and tris(perfluoroethylsulfonyl)methanide anion.

The heat acid generator is contained by preferably 0.1 to 15 parts by weight, more preferably 0.2 to 10 parts by weight per 100 parts by weight of the resin A. In this range, the composition A is hardened enough and the preservation stability of the composition A is high.

The resin composition A may include the solvent. Examples of the solvent include: ketones such as cyclohexanone, cyclopentanone, methyl-2-n-amyl ketone; alcohols such as 3-methoxy butanol, 3-methyl-3-methoxy butanol, 1-methoxy-2-propanol, and 1-ethoxy-2-propanol; ethers such as propylene glycol monomethyl ether, ethylene glycol monomethyl ether, propylene glycol monoethyl ether, ethylene glycol mono ethyl ether, propylene glycol dimethyl ether, and diethylene glycol dimethyl ether; and propylene glycol monomethyl ether acetate, propylene glycol monoethyl ether acetate, ethyl lactate, ethyl pyruvate, butyl acetate, 3-methoxy methyl propionate, 3-ethoxy ethyl propionate, tert-butyl acetate, tert-butyl propionate, propylene glycol mono-tert-butyl ether acetate, γ-butyrolactone, and other esters. Any one of these can be used alone or two or more kinds thereof can be used in mixture. The solvent is contained by preferably 100 to 5,000 parts by weight, more preferably 150 to 2,500 parts by weight per 100 parts by weight of the resin A.

The resin composition A can be used as a film-shaped composition free of the solvent.

The resin composition A may contain, for example, a surfactant or an antioxidant for enhancing the heat resistance, if necessary.

The surfactant is not limited to a particular kind and examples thereof include: polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenyl ether and polyoxyethylene nonylphenyl ether; polyoxyethylene polyoxypropylene block copolymers; sorbitan fatty acid esters such as sorbitan monolaurate, sorbitan monopalmitate, and sorbitan monostearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and other nonion-based surfactants; EFTOP (registered trademark) EF301, EF303, and EF352 (Tochem Products Co., Ltd.), Megaface (registered trademark) F171, F172, and F173 (DIC Corporation), Fluorad (registered trademark) FC430 and FC431 (3M), Asahi-Guard AG710, Surflon (registered trademark) S-381, S-382, SC101, SC102, SC103, SC104, SC105, and SC106, Surfynol (registered trademark) E1004, KH-10, KH-20, KH-30, and KH-40 (AGC Inc.), and other fluorine-based surfactants; and organosiloxane polymer KP341, X-70-092, X-70-093, and X-70-1102 (Shin-Etsu Chemical Co., Ltd.) and acrylic acid or methacrylic acid polyflow No. 75 and No. 95 (Kyoeisha Chemical Co., Ltd.). Any one of these can be used alone, or two or more kinds thereof can be used in combination.

The antioxidant is preferably at least one kind selected from the group consisting of a hindered phenol compound, a hindered amine compound, an organic phosphorous compound, and an organic sulfur compound.

The hindered phenol compound is not limited to a particular kind; for example, the following compounds are preferable: 1,3,5-trimethyl-2,4,6-tris(3,5-di-tert-butyl-4-hydroxy-benzyl)benzene (product name: IRGANOX 1330); 2,6-di-tert-butyl-4-methylphenol (product name: Sumilizer BHT); 2,5-di-tert-butyl-hydroquinone (product name: Nocrac NS-7); 2,6-di-tert-butyl-4-ethylphenol (product name: Nocrac M-17); 2,5-di-tert-amylhydroquinone (product name: Nocrac DAH); 2,2'-methylenebis(4-methyl-6-tert-butylphenol) (product name: Nocrac NS-6); 3,5-di-tert-butyl-4-hydroxy-benzylphosphonate-diethylester (product name: IRGANOX 1222); 4,4'-thiobis(3-methyl-6-tert-butylphenol) (product name: Nocrac 300); 2,2'-methylenebis(4-ethyl-6-tert-butylphenol) (product name: Nocrac NS-5); 4,4'-butylidenebis(3-methyl-6-tert-butylphenol) (product name: ADEKA STAB AO-40); 2-tert-butyl-6-(3-tert-butyl-2-hydroxy-5-methylbenzyl)-4-methylphenylacrylate (product name: Sumilizer GM); 2-[1-(2-hydroxy-3,5-di-tert-pentylphenyl)ethyl]-4,6-di-tert-pentylphenylacrylate (product name: Sumilizer GS); 2,2'-methylenebis[4-methyl-6-(α-methyl-cyclohexyl)phenol]; 4,4'-methylenebis(2,6-di-tert-butylphenol (product name: SEENOX 226M); 4,6-bis(octylthiomethyl)-o-cresol (product name: IRGANOX 1520L); 2,2'-ethylenebis(4,6-di-tert-butylphenol); octadecyl-3-(3,5-di-tert-butyl-4-hydroxyphenyl)-propionate (product name: IRGANOX 1076); 1,1,3-tris(2-methyl-4-hydroxy-5-tert-butylphenyl)butane (product name: ADEKA STAB AO-30); tetrakis[methylene-(3,5-di-tert-butyl-4-hydroxyhydrocinnamate)]methane (product name: ADEKA STAB AO-60); triethyleneglycolbis[3-(3-tert-butyl-5-methyl-4-hydroxyphenyl)propionate] (product name: IRGANOX 245); 2,4-bis(n-octylthio)-6-(4-hydroxy-3,5-di-tert-butylanilino)-1,3,5-triazine (product name: IRGANOX 565); N,N'-hexamethylenebis(3,5-di-tert-butyl-4-hydroxyhydrocinnamamide) (product name: IRGANOX 1098); 1,6-hexanediol-bis[3-(3,5-di-tert-butyl-4-hydroxyphenyl)propionate] (product name: IRGANOX 259); 2,2-thiodiethylene-bis[3-(3,5-di-tert-butyl-4-hydroxyphenyl)

propionate] (product name: IRGANOX 1035); 3,9-bis[2-[3-(3-tert-butyl-4-hydroxy-5-methylphenyl)propionyloxy]1,1-dimethylethyl]-2,4,8,10-tetraoxaspiro[5.5]undecane (product name: Sumilizer GA-80); tris-(3,5-di-tert-butyl-4-hydroxybenzyl)isocyanruate (product name: IRGANOX 3114); bis(3,5-di-tert-butyl-4-hydroxybenzylphosphonic acid ethyl)calcium/polyethylene wax mixture (50:50) (product name: IRGANOX 1425WL); isooctyl-3-(3,5-di-tert-butyl-4-hydroxyphenyl)-propionate (product name: IRGANOX 1135); 4,4'-thiobis(6-tert-butyl-3-methylphenol) (product name: Sumilizer WX-R); and 6-[3-(3-tert-butyl-4-hydroxy-5-methylphenyl)-propoxy]-2,4,8,10-tetra-tert-butyldibenz[d,f][1,3,2]dioxaphosphepin (product name: Sumilizer GP).

The hindered amine compound is not limited to a particular kind; for example, the following compounds are preferable: p,p'-dioctyldiphenylamine (product name: IRGANOX 5057); phenyl-α-naphthylamine (product name: Nocrac PA); poly(2,2,4-trimethyl-1,2-dihydroquinoline) (product name: Nocrac 224, 224-S); 6-ethoxy-2,2,4-trimethyl-1,2-dihydroquino line (product name: Nocrac AW); N,N'-diphenyl-p-phenylene-diamine (product name: Nocrac DP); N,N'-di-β-naphthyl-p-phenylenediamine (product name: Nocrac White); N-phenyl-N'-isopropyl-p-phenylenediamine (product name: Nocrac 810NA); N,N'-diallyl-p-phenylenediamine (product name: Nonflex TP); 4,4'-(α,α-dimethylbenzyl)diphenylamine (product name: Nocrac CD); p,p-toluenesulfonylamino-diphenylamine (product name: Nocrac TD); N-phenyl-N'-(3-methaciyloyloxy-2-hydroxypropyl)-p-phenylenediamine (product name: Nocrac G1); N-(1-methylheptyl)-N'-phenyl-p-phenylenediamine (product name: Ozonon 35); N,N'-di-sec-butyl-p-phenylenediamine (product name: Sumilizer BPA); N-phenyl-N'-1,3-dimethylbutyl-p-phenylene-diamine (product name: Antigene 6C); allcylated diphenylamine (product name: Sumilizer 9A); succinic acid dimethyl-1-(2-hydroxyethyl)-4-hydroxy-2,2,6,6-tetramethylpiperidine polycondensate (product name: Tinuvin 622LD); poly[[6-(1,1,3,3-tetramethylbutyl)amino-1,3,5-triazine-2,4-diyl][(2,2,6,6-tetramethyl-4-piperidyl)imino]hexamethylene[(2,2,6,6-tetramethyl-4-piperidyl)imino]] (product name: CHIMASSORB 944); N,N'-bis(3-aminopropyl)ethylenediamine-2,4-bis[N-butyl-N-(1,2,2,6,6-pentamethyl-4-piperidyl)-amino]-6-chloro-1,3,5-hiazine condensate (product name: CHIMASSORB 119FL); bis(1-octyloxy-2,2,6,6-tetraethyl-4-piperidyl)sebacate (product name: TINUVIN 123); bis(2,2,6,6-tetramethyl-4-piperidyl)sebacate (product name: TINUVIN 770); 2-(3,5-di-tert-butyl-4-hydroxybenzyl)-2-n-butylmalonic acid bis(1,2,2,6,6-pentamethyl-4-piperidyl) (product name: TINUVIN 144); bis(1,2,2,6,6-pentamethyl-4-piperidyl)sebacate (product name: TINUVIN 765); tetrakis(1,2,2,6,6-pentamethyl-4-piperidyl)1,2,3,4-butanetetra-carboxylate (product name: LA-57); tetrakis(2,2,6,6-tetramethyl-4-piperidyl)1,2,3,4-butanetetracarboxylate (product name: LA-52); an esterified product of a mixture of 1,2,3,4-butanetetracarboxylic acid, and 1,2,2,6,6-pentamethyl-4-piperidinol and 1-tridecanol (product name: LA-62); an esterified product of a mixture of 1,2,3,4-butanetetracarboxylic acid, and 2,2,6,6-tetramethyl-4-pipericlinol and 1-tridecanol (product name: LA-67); an esterified product of a mixture of 1,2,3,4-butanetetracarboxylic acid, and 1,2,2,6,6-pentamethyl-4-piperidinol and 3,9-bis(2-hydroxy-1,1-dimethylethyl)-2,4,8,10-tetraoxaspiro[5.5]undecane (product name: LA-63P); an esterified product of a mixture of 1,2,3,4-butanetetracarboxylic acid, and 2,2,6,6-tetramethyl-4-piperidinol and 3,9-bis(2-hydroxy-1,1-dimethylethyl)-2,4,8,10-tetraoxaspiro[5.5]undecane (product name: LA-68LD); (2,2,6,6-tetramethylene-4-piperidyl)-2-propylenecarboxylate (product name: ADEKA STAB LA-82); and (1,2,2,6,6-pentamethyl-4-piperidyl)-2-propylenecarboxylate (product name: ADEKA STAB LA-87).

The organic phosphorus compound is not limited to a particular kind; for example, the following compounds are preferable: bis(2,4-di-tert-butylphenyl)[1,1-biphenyl]-4,4'-diylbisphosphite; 9,10-dihydro-9-oxa-10-phosphaphenanthrene-10-oxide (product name: SANKO-HCA); triethylphosphite (product name: JP302); tri-n-butylphosphite (product name: JP304); triphenylphosphite (product name: ADEKA STAB TPP); diphenylmonooctylphosphite (product name: ADEKA STAB C); tri(p-cresyl)phosphite (product name: Chelex-PC); diphenylmonodecylphosphite (product name: ADEKA STAB 135A); dipheylmono(tridecyl) phosphite (product name: JPM313); tris(2-ethylhexyl) phosphite (product name: JP308); phenyldidecylphosphite (product name: ADEKA STAB 517); tridecylphosphite (product name: ADEKA STAB 3010); tetraphenyl dipropylene glycol diphosphite (product name: JPP100); bis(2,4-di-tert-butylphenyl)pentaerythritol diphosphite (product name: ADEKA STAB PEP-24G); tris(tridecyl)phosphite (product name: JP333E); bis(nonylphenyl)pentaerythritol diphosphite (product name: ADEKA STAB PEP-4C); bis(2,6-di-tert-butyl-4-methylphenyl)pentaerythritol diphosphite (product name: ADEKA STAB PEP-36); bis[2,4-di(1-phenylisopropyl)phenyl]pentaerythritol diphosphite (product name: ADEKA STAB PEP-45); trilauryltrithiophosphite (product name: JPS312); tris(2,4-di-tert-butylphenyl)phosphite (product name: IRGAFOS 168); tris(nonylphenyl) phosphite (product name: ADEKA STAB 1178); distearyl pentaerythritol diphosphite (product name: ADEKA STAB PEP-8); tris(mono, dinonylphenyl)phosphite (product name: ADEKA STAB 329K); trioleylphosphite (product name: Chelex-OL); tristearylphosphite (product name: JP318E); 4,4'-butylidenebis(3-methyl-6-tert-butylphenylditridecyl) phosphite (product name: JPH1200); tetra($C_{12}$-$C_{15}$ mixed alkyl)-4,4'-isopropylidenediphenyldiphosphite (product name: ADEKA STAB 1500); tetra(tridecyl)-4,4'-butylidenebis(3-methyl-6-tert-butylphenol)diphosphite (product name: ADEKA STAB 260); hexa(tridecyl)-1,1,3-tris(2-methyl-5-tert-butyl-4-hydroxyphenyl)butane-biphosphite (product name: ADEKA STAB 522A); hydrogenated bisphenol A phosphite polymer (HBP); tetrakis(2,4-di-tert-butylphenyloxy)4,4'-biphenylene-di-phosphine (product name: P-EPQ); tetrakis(2,4-di-tert-butyl-5-methylphenyloxy)4,4'-biphenylene-di-phosphine (product name: GSY-101P); 2-[[2,4,8,10-tetrakis(1,1-dimethylethyl)-dibenzo[d,f][1,3,2]dioxaphosphepin-6-yl]oxy]-N,N-bis[2-[[2,4,8,10-tetrakis(1,1-dimethylethyl)dibenzo[d,f][1,3,2]dioxaphosphepin-6-yl]oxy]-ethyl]ethanamine (product name: IRGAFOS 12); and 2,2'-methylenebis(4,6-di-tert-butylphenyl)octylphosphite (product name: ADEKA STAB HP-10).

The organic sulfur compound is not limited to a particular compound; for example, the following compounds are preferable: dilauryl-3,3'-thiodipropionate (product name: Sumilizer TPL-R); dimyristyl-3,3'-thiodipropionate (product name: Sumilizer TPM); distearyl-3,3'-thiodipropionate (product name: Sumilizer TPS); pentaerythritoltetrakis(3-laurylthiopropionate) (product name: Sumilizer TP-D); ditridecyl-3,3'-thiodipropionate (product name: Sumilizer TL); 2-mercaptobenzimidazole (product name: Sumilizer MB); ditridecyl-3,3'-thiodipropionate (product name: ADEKA STAB AO-503A); 1,3,5-tris-β-stearylthiopropionyloxyethylisocyanurate; 3,3'-thiobispropionate didodecylester (product name: IRGANOX PS 800FL); and 3,3'-thiobispropionate diocdecylester (product name: IRGANOX PS 802FL).

Among the antioxidants described above, tetrakis[methylene-(3,5-di-tert-butyl-4-hydroxyhydrocinnainate)]methane is particularly preferable. The antioxidant is added by preferably 0.5 to 5 parts by weight, more preferably 1 to 3 parts by weight, per 100 parts by weight of the resin A. In this range, the enough heat resistance effect can be achieved and the compatibility can be obtained. Note that any one of the antioxidants can be used alone, or two or more kinds thereof can be used in combination.

To the resin composition A, 50 parts by weight or less of filler such as known silica may be added per 100 parts by weight of the resin A in order to enhance the heat resistance.

If the resin composition A is a solution, the resin composition A is applied on the support body by a method of spin coating, roll coating, die coating, printing, dipping, or the like and prebaking the applied resin composition A at preferably 80 to 200° C., more preferably 100 to 180° C., in accordance with the evaporation condition of the solvent, so that the solvent is evaporated. Thus, a resin composition layer A' is formed.

On the other hand, if the resin composition A is a film-shaped composition, the resin composition layer A' can be formed on the support body by a laminating method.

The resin composition layer A' formed on the support body is further thermally hardened, and thus functions as the resin layer A. The thermal hardening can be performed using a hot plate or an oven under a condition of, usually, 100 to 350° C. for 5 to 10 minutes, preferably 150 to 300° C. for 3 to 8 minutes. This hardening reaction can also be achieved by, after forming a non-hardened wafer laminate without hardening the resin composition layer A', heating the entire laminate.

The film thickness of the resin layer A formed on the support body is preferably 0.1 to 50 μm, more preferably 0.3 to 30 μm. In this film thickness range, the light-blocking property is enough and the film has preferable flatness.

Resin Layer B

The resin layer B is a resin layer in contact with the resin layer A formed on the support body side of the wafer laminate, and is to be removed by peeling after the support body is separated.

The resin in the resin layer B is thermosetting silicone resin or non-silicone thermoplastic resin (that is, thermoplastic resin free of siloxane skeleton).

The thermosetting silicone resin is preferably formed to include the repeating unit represented by the following formula (2) and optionally the repeating unit represented by the following formula (3) (hereinafter referred to as epoxy-modified silicone resin).

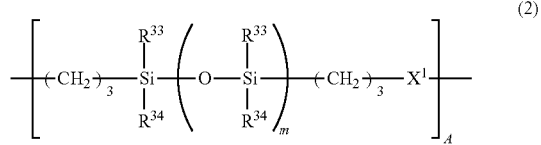

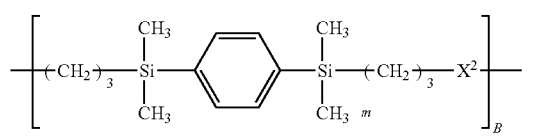

In the formula, $R^{31}$ to $R^{34}$ independently represent a monovalent hydrocarbon group of 1 to 8 carbon atoms, and m is an integer of 1 to 100. Moreover, in the formula, A and B are numbers satisfying $0 < A \le 1$, $0 \le B < 1$, and $A+B=1$, and $X^1$ and $X^2$ each represent a bivalent organic group represented by the following formula (4).

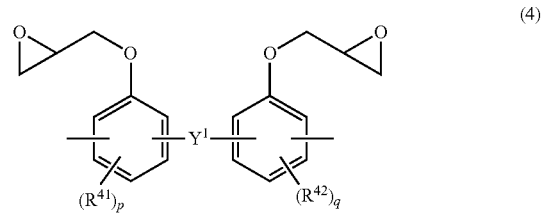

In the formula, $Y^1$ represents a single bond, a methylene group, a propane-2,2-diyl group, a 1,1,1,3,3,3-hexafluoropropane-2,2-diyl group, or a fluorene-9,9-diyl group, $R^{41}$ and $R^{42}$ independently represent an alkyl group or an alkoxy group of 1 to 4 carbon atoms, and p and q independently represent 0, 1, or 2.

The epoxy-modified silicone resin preferably has an Mw of 3,000 to 500,000, more preferably 10,000 to 100,000. The amount of siloxane contained in the epoxy-modified silicone resin is desirably controlled to be within 30 to 80% by weight in the resin.

The epoxy-modified silicone resin can be synthesized in accordance with a method disclosed in, for example, JP-A 2013-110391.

If the resin layer B contains the epoxy-modified silicone resin, the resin layer B is preferably formed of a hardened product of a resin composition B-1 containing the epoxy-modified silicone resin. Here, for the thermal hardening, the resin composition B-1 preferably includes at least one kind of crosslinker selected from a phenol compound with two or more phenolic hydroxy groups on the average in one molecule and an epoxy compound with two or more epoxy groups on the average in one molecule.

The epoxy compound is not limited to a particular compound, and the examples shown in the description of the resin layer A may be used.

The phenol compound is not limited to a particular compound; for example, m- or p-cresol novolac resin (for example, EP-6030G, ASAHI YUKIZAI CORPORATION), a trifunctional phenol compound (for example, Tris-P-PA, Honshu Chemical Industry Co., Ltd.), a tetrafunctional phenol compound (for example, TEP-TPA ASAHI YUKIZAI CORPORATION), or the like can be used.

The crosslinker is contained by preferably 0.1 to 50 parts by weight, more preferably 0.1 to 30 parts by weight, and much more preferably 1 to 20 parts by weight per 100 parts by weight of the epoxy-modified silicone resin. The crosslinker can be used alone or two or more kinds thereof may be used in combination.

In addition, the resin composition B-1 may contain 10 parts by weigh or less of a hardening catalyst such as acid anhydride per 100 parts by weight of the epoxy-modified silicone resin.

The resin composition B-1 may contain a solvent. Examples of the solvent include ketones such as cyclohexanone, cyclopentanone, and methyl-2-n-amylketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; and esters such as propylene glycol monomethyl ether acetate, propylene glycol monoethyl ether acetate, ethyl lactate, ethyl pyruvate, butyl acetate, 3-methoxy methyl propionate, 3-ethoxy ethyl propionate, tert-butyl acetate, tert-butyl propionate, propylene glycol mono-tert-butyl ether acetate, and γ-butyrolactone. Any of these solvents can be used alone or two or more kinds thereof may be used in combination. The solvent is contained by preferably 40 to 1,000 parts by weight, more preferably 50 to 600 parts by weight, per 100 parts by weight of the epoxy-modified silicone resin.

The resin composition B-1 can also be used as a film-shaped composition free of the solvent.

The resin composition B-1 may contain a surfactant and an antioxidant in order to homogenize the coatability and improve the heat resistance. The surfactant and the antioxidant may be those that are given as the examples in the description of the resin layer A.

For the higher heat resistance, the resin composition B-1 may contain 50 parts by weight or less of filler such as silica per 100 parts by weight of the epoxy-modified silicone resin.

If the resin composition B-1 is a solution, the resin composition B-1 is applied on the resin layer A or the resin composition layer A' by a method of spin coating, roll coating, die coating, printing, dipping, or the like and pre-baked at preferably 60 to 160° C. for 1 to 4 minutes, more preferably 80 to 140° C. for 2 to 4 minutes in accordance with the evaporating condition of that solvent so that the solvent is evaporated. Thus, a resin composition layer B1 can be formed.

On the other hand, if the resin composition B-1 is a film-shaped composition, the resin composition layer B1 can be formed on the resin layer A or the resin composition layer A' by a laminating method.

Depending on the kind of the wafer used in the laminate, the heat resistance required in the production may be relatively low. In this case, the resin layer B may be formed of the resin composition B-1 free of the crosslinker and the hardening catalyst.

If the resin layer B contains the epoxy-modified silicone resin, for the purpose of bonding together the support body and the silicon wafer, which are different kinds of substrates, and from the viewpoint of suppressing the warpage, the elastic modulus of the resin layer B at 25° C. is preferably 10 to 1,000 MPa. In the present invention, the elastic modulus refers to the elastic modulus (E') that is measured using a known dynamic visco-elastometer under a tensile condition where the hardened product for forming the resin layer B has a rectangular shape with a thickness of 0.5 mm and a length of 30 mm×10 mm and the frequency is 1 Hz.

In addition, the resin of the resin layer B may be thermosetting silicone resin free of the epoxy group (hereinafter referred to as silicone resin free of epoxy group).

One example of the silicone resin free of epoxy group results from hardening a composition (hereinafter also referred to as resin composition B-2) containing:
(b1) organopolysiloxane containing two or more alkenyl groups in one molecule;
(b2) organohydrogenpolysiloxane containing two or more hydrogen atoms bonded to silicon atoms (Si—H groups) in one molecule; and
(b3) platinum catalyst.

The component (b1) is organopolysiloxane containing two or more alkenyl groups in one molecule, and for example, linear or branched diorganopolysiloxane containing two or more alkenyl groups in one molecule, organopolysiloxane with a resin structure having a siloxane unit (Q unit) represented by $SiO_{4/2}$, and the like are given. In particular, a preferable example of the component (b1) is diorganopolysiloxane containing two or more alkenyl groups in one molecule with an alkenyl group content ratio of 0.6 to 9 mol %, or organopolysiloxane with a resin structure. In the present invention, the alkenyl group content ratio is the ratio (mol %) of the number of alkenyl groups to the number of silicon atoms in the molecule.

Specific examples of such organopolysiloxane include the ones represented by the following formulae (b1-1), (b1-2), and (b1-3). Any one of these may be used alone or two or more kinds thereof may be used in combination.

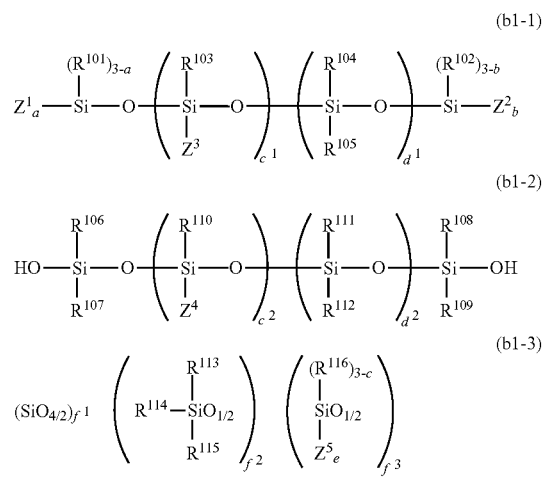

In formulae (b1-1) to (b1-3), $R^{101}$ to $R^{116}$ independently represent a monovalent hydrocarbon group other than an aliphatic unsaturated hydrocarbon group and $Z^1$ to $Z^5$ independently represent a monovalent organic group containing an alkenyl group.

In formula (b1-1), a and b independently represent an integer of 0 to 3. In formulae (b1-1) and (b1-2), $c^1$, $c^2$, $d^1$, and $d^2$ are integers satisfying $0 \leq c^1 \leq 10$, $2 \leq c^2 \leq 10$, $0 \leq d^1 \leq 100$, and $0 \leq d^2 \leq 100$, and a, b, $c^1$, $c^2$, $d^1$, and $d^2$ are preferably the combination of numbers that makes the alkenyl group contained by 0.6 to 9 mol %.

In formula (b1-3), e is an integer of 1 to 3, and $f^1$, $f^2$, and $f^3$ are numbers satisfying $(f^2+f^3)/f^1=0.3$ to 3.0 and $f^3/(f^1+f^2+f^3)=0.01$ to 0.6.

The monovalent hydrocarbon group other than the aliphatic unsaturated hydrocarbon group is preferably the group of 1 to 10 carbon atoms, and examples thereof include alkyl groups such as a methyl group, an ethyl group, an n-propyl group, an isopropyl group, an n-butyl group, a tert-butyl group, an n-pentyl group, and an n-hexyl group; cycloalkyl groups such as a cyclopentyl group and a cyclohexyl group; and aryl groups such as a phenyl group and a tolyl group. Among these groups, a phenyl group or an alkyl group such as a methyl group is preferable.

The monovalent organic group containing an alkenyl group is preferably an organic group of 2 to 10 carbon atoms, and examples thereof include: alkenyl groups such as a vinyl group, an allyl group, a hexenyl group, and an octenyl group; (meth)acryloyl alkyl groups such as an acryloyl propyl group, an acryloyl methyl group, and a methacryloyl propyl group; (meth)acryloxy alkyl groups such as an acryloxy propyl group, an acryloxy methyl group, and a methacryloxy propyl group; and monovalent hydrocarbon groups containing an alkenyl group, such as a cyclohexenyl ethyl group and a vinyloxy propyl group. Among these groups, a vinyl group is preferable from the industrial point of view.

In formula (b1-1), a and b are independently an integer of 0 to 3. If a is 1 to 3, a molecule chain end is terminated by the alkenyl group; therefore, the reaction can be completed in a short time by this alkenyl group at the molecule chain end with high reactivity. In addition, a=1 is industrially preferable from the viewpoint of the cost. The diorganopolysiloxane containing an alkenyl group represented by formula (b1-1) is preferably in the form of oil or raw rubber.

The organopolysiloxane represented by formula (b1-3) has the resin structure with the $SiO_{4/2}$ unit. In the formula, e independently represents an integer of 1 to 3, and e=1 is industrially preferable from the viewpoint of the cost. It is preferable that the product of the average value of e and $f^3/(f^1+f^2+f^3)$ is in the range of 0.02 to 1.5, more preferably 0.03 to 1.0. The organopolysiloxane with this resin structure may be used as the solution in which this organopolysiloxane is dissolved in an organic solvent.

The component (b2) is a crosslinker, and is organohydrogenpolysiloxane containing at least two, preferably three or more, hydrogen atoms bonded to silicon atoms (Si—H groups) in one molecule. The organohydrogenpolysiloxane may be either linear, branched, or cyclic. Any of the organohydrogenpolysiloxanes may be used alone or two or more kinds thereof may be used in combination.

The organohydrogenpolysiloxane preferably has a viscosity of 1 to 5,000 mPa·s, more preferably 5 to 500 mPa·s at 25° C.

In the resin composition B-2, the component (b2) is contained so that the total of Si—H groups in the component (b2) per the total of the alkenyl groups in the component (b1) is in the range of preferably 0.3 to 10, more preferably 1.0 to 8.0 in molar ratio (Si—H group/alkenyl group). If the molar ratio is 0.3 or more, the crosslinking density will not become lower and a problem of failure in hardening the adhesive layer will not occur. If the molar ratio is 10 or less, the extreme decrease in crosslinking density can be suppressed.

The component (b3) is a platinum-based catalyst (that is, platinum group metals) and examples thereof include chloroplatinic acid, alcohol solution of chloroplatinic acid, a product resulting from a reaction between chloroplatinic acid and alcohol, a product resulting from a reaction between chloroplatinic acid and an olefin compound, and a product resulting from a reaction between chloroplatinic acid and siloxane containing a vinyl group.

In the resin composition B-2, the component (b3) is contained by the effective amount, and the amount thereof is usually 1 to 5,000 ppm, preferably 5 to 2,000 ppm as the platinum group metal (in weight) per the total of the components (b1) and (b2). If the amount is 1 ppm or more, the hardness, the crosslinking density, and the retention power of the composition will not become lower. If the amount is 5,000 ppm or less, the process bath can be used longer.

The resin composition B-2 may contain a reaction controlling agent (b4) as an arbitrary component. The reaction controlling agent is added arbitrarily as necessary in order to, when the resin composition B-2 is prepared or applied to the base material, prevent the processing solution from being thickened or gelated before the thermal hardening.

Specific examples thereof include 3-methyl-1-butyne-3-ol, 3-methyl-1-pentyne-3-ol, 3,5-dimethyl-1-hexyne-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynyloxy)dimethylsilane, 1,3,5,7-tetramethyl-1,3,5,7-tetravinylcyclotetrasiloxane, and 1,1,3,3-tetramethyl-1,3-divinyldisiloxane. Among these, 1-ethynylcyclohexanol and 3-methyl-1-butyne-3-ol are preferable.

In the resin composition B-2, the component (b4) is contained by usually 0 to 8 parts by weight, preferably 0.01 to 8 parts by weight, and more preferably 0.05 to 2 parts by weight per the total 100 parts by weight of the components (b1) and (b2). If the amount is 8 parts by weight or less, the hardness of the composition will not become lower. If the amount is 0.01 parts by weight or more, the effect of the reaction control is achieved sufficiently.

The resin composition B-2 may contain an organic solvent (b5) as an arbitrary component. The organic solvent is not limited to a particular solvent and may be any solvent that can dissolve the components (b1) to (b4). Preferable examples thereof include hydrocarbon solvents such as pentane, hexane, cyclohexane, isooctane, nonane, decane, p-menthane, pinene, isododecane, and limonene, and silicone solvents. If the resin composition B-2 contains the solvent, the resin layer B can be formed on the wafer by a method of spin coating, roll coating, or the like. The solvent is contained preferably 10 to 900 parts by weight, more preferably 25 to 400 parts by weight, and much more preferably 40 to 300 parts by weight per 100 parts by weight of the component (b1).

The resin composition B-2 can be formed to have a film shape.

To the resin composition B-2, a known antioxidant can be added for the purpose of improving the heat resistance.

The silicone resin free of epoxy group has an Mw of preferably 40,000 to 550,000, more preferably 50,000 to 500,000.

The hardened product of the resin composition B-2 preferably has an elastic modulus of $1\times10^6$ to $1\times10^9$ Pa at 25° C. The composition with the elastic modulus in this range is preferable because this composition can sufficiently resist the grinding step for thinning a circuit board and does not adhere to the device in the step of reducing the warpage of the substrate, for example.

If the heat resistance required in the production is relatively low, the resin layer B may contain non-silicone thermoplastic resin. In this case, after the support body is separated, the resin on the wafer is separated by peeling, and then, cleaning and removal by the solvent can be performed.

The non-silicone thermoplastic resin is particularly preferable the non-silicone thermoplastic resin with a glass transition temperature of about −80 to 120° C. and an Mw of 20,000 to 200,000, more preferably 30,000 to 150,000.

Examples of the non-silicone thermoplastic resin include non-silicone thermoplastic elastonier such as polyolefin base thermoplastic elastomer, polybutadiene base thermoplastic elastomer, polystyrene base thermoplastic elastomer, polystyrene-butadiene base thermoplastic elastomer, polystyrene-olefin base thermoplastic elastomer, and these elastomers that have been hydrogenated. In particular, hydrogenated polystyrene elastomer with excellent heat resistance is preferable. Specifically, Tuftek (registered trademark) (Asahi Kasei Chemicals Corporation), ESPOLEX (registered trademark) SB series (SUMITOMO CHEMICAL COMPANY, LIMITED), RABARON (registered trademark) (Mitsubishi Chemical Corporation), SEPTON (registered trademark) (KURARAY CO., LTD.), DYNARON (registered trademark) (JSR Corporation), and the like are given. The non-silicone thermoplastic resin is, for example, cycloolefin polymer typified by ZEONEX (registered trademark) (ZEON CORPORATION), cyclic olefin copolymer typified by TOPAS (registered trademark) (TOPAS ADVANCED POLYMERS GMBH), or the like.

The non-silicone thermoplastic resin is preferably non-silicone thermoplastic elastomer. If a composite temporary adhesive layer including a layer containing the non-silicone thermoplastic elastomer is used, after a thin wafer is produced, this wafer can be separated easily from the support body. Therefore, the thin wafer, which is easily broken, can be treated more easily.

If the resin layer B includes the non-silicone thermoplastic resin, the resin layer B is preferably a hardened product of the resin composition B-3 containing the non-silicone thermoplastic resin.

The resin composition B-3 may include the antioxidant for the purpose of improving the heat resistance, the surfactant for improving the coatability, or a mold-releasing agent for improving the separability. Examples of the antioxidant include di-tert-butylphenol. Examples of the surfactant include fluorine silicone surfactant X-70-1102 (Shin-Etsu Chemical Co., Ltd.). Examples of the mold-releasing agent include KF-96 (Shin-Etsu Chemical Co., Ltd.).

The resin composition B-3 may contain a solvent. The solvent may be a hydrocarbon solvent. Preferable examples thereof include nonane, p-menthane, pinene, isooctane, toluene, xylene, and mesitylene. For the coatability, nonane, p-menthane, isooctane, and mesitylene are more preferable. Any of these solvents can be used alone or two or more kinds thereof can be used in combination. The solvent is contained by preferably 250 to 3,500 parts by weight, more preferably 300 to 2,000 parts by weight per 100 parts by weight of the non-silicone thermoplastic resin.

The resin composition B-3 can also be used as a film-shaped composition free of the solvent.

If the resin composition B-3 is a solution, the solution is applied on the wafer by a method of spin coating, roll coating, die coating, printing, dipping, or the like and then heated using a hot plate or an oven; thus, the resin layer B can be formed. In this case, the heating condition is usually 1 to 10 minutes at 100 to 200° C., preferably 2 to 5 minutes at 130 to 190° C.

The resin layer B has a thickness of preferably 1 to 200 μm, more preferably 5 to 150 μm. With the thickness in this range, sufficient adhesiveness is achieved in the bonding, and the bonded wafer has high flatness.

Method for Producing Thin Wafer

As described above, the method for producing a thin wafer according to the present invention includes the step of separating the support body from the wafer laminate, and the step of removing the resin layer remaining on the wafer from the wafer by peeling. The other steps may be the known steps. The method for producing a thin wafer according to the present invention may include the following steps (a) to (h), for example.

Step (a) or (a')

The step (a) is a step of forming the resin layer A on the support body and the step (a') is a step of forming the resin composition layer A' on the support body. If the resin composition A for forming the resin layer A is a solution, the solution is applied on the support body by a method of spin coating, roll coating, or the like and prebaked at preferably 80 to 200° C., more preferably 100 to 180° C. in accordance with the evaporating condition of the solvent, so that the solvent is evaporated. Thus, the resin composition layer A' is formed. If the resin composition A is a film-shaped composition, the resin composition layer A' is formed on the support body by a laminating method.

The resin composition layer A' formed on the support body can function as the resin layer A by thermal hardening. The thermal hardening can be performed using a hot plate or an oven at usually 100 to 350° C., preferably 150 to 300° C. The hardening time is usually 1 to 10 minutes, preferably 2 to 8 minutes. This hardening reaction can also be achieved by, after forming a non-hardened wafer laminate without hardening the resin composition layer A', heating the entire wafer laminate.

Step (b) or (b')

The step (b) is a step of forming the resin layer B on a circuit formation surface of the wafer, and the step (b') is a step of forming the resin layer B on the resin layer A or the resin composition layer A'. If the resin compositions B-1 to B-3 are a solution, the solution is applied on the wafer by a method of spin coating, roll coating, die coating, printing, dipping, or the like and heated using a hot plate or an oven at 130 to 190° C. Thus, the resin layer B is formed.

On the other hand, if the resin compositions B-1 to B-3 are film-shaped compositions, the resin layer B can be formed on the wafer by a laminating method.

Step (c) or (c')

The step (c) is a step of bonding the resin layer A or the resin composition layer A' and the resin layer B together under reduced pressure, and the step (c') is a step of bonding the resin layer B on the support body and the circuit formation surface of the wafer together under reduced pressure. The reduced-pressure condition is preferably 0.1 to 100 Pa, more preferably 1 to 80 Pa. In this case, the substrate is uniformly compressed and bonded under the reduced pressure in a temperature range of preferably 40 to 240° C., more preferably 60 to 220° C.

Step (d)

The step (d) is a step of forming the resin layer A by thermally hardening the resin composition layer A' of the wafer laminate that has been bonded in the step (c) or (c'), and bonding the resin layer A to the resin layer B. After the wafer laminate is formed, thermal hardening is performed by heating at 120 to 260° C., preferably 150 to 250° C. for 1 minute to 4 hours, preferably 3 minutes to 2 hours.

Step (e)

The step (e) is a step of, for a wafer whose circuit non-formation surface has been ground, that is, the wafer that has been thinned by back surface grinding, processing the circuit non-formation surface of the wafer. This step includes various processes that are used in the wafer level. Examples thereof include a wafer surface process, electrode formation, metal line formation, and protective film formation. More specifically, CVD and laser annealing for processing the wafer surface, metal sputtering for forming electrodes and the like, evaporation, wet etching for etching a metal sputtering layer, application of resist to be used as a mask for forming metal lines, formation of patterns by light exposure and development, separation of the resist, dry etching, formation of metal plating, formation of an organic film for surface protection, silicon etching for TSV formation, formation of an oxide film on the silicon surface, and other conventionally known processes are given. In the processes as described above, the wafer processed body preferably has a resistance in a high-temperature range up to about 400° C., and preferably has strength and lifetime at a temperature of 300° C. or higher.

Step (f)

The step (f) is a step of separating the support body from the thin wafer laminate processed in the step (e). This separating step is performed under a condition of relatively low temperature that is usually about room temperature, and preferably includes:

(f1) a step of attaching a dicing tape to a processing surface (back surface) of the wafer that has been processed;

(f2) a step of sucking a dicing tape surface to a suction surface to vacuum; and (f3) a step of separating the support body from the thin wafer laminate by delivering, for example, a laser with a wavelength of 355 nm from the support body side of the thin wafer laminate.

Thus, the support body can be separated from the wafer laminate easily and the subsequent dicing step can be performed easily. Note that the dicing tape may be a known tape formed of a polyester or polyethylene film or the like.

Step (g)

The step (g) is a step of, after separating the support body in the step (f), separating the resin layer A and the resin layer B, which have remained without being decomposed by the laser from the processed wafer, by the tape peeling or the like.

This separating step is performed at a relatively low-temperature condition ranging from room temperature to about 60° C. In one example of the separating method in the step (g), the wafer after the step (f) is fixed horizontally and a tape material for separateion is pasted to the resin layer A that is exposed and not decomposed; then, by separating the tape material by peeling, the resin layer A and the resin layer B, which have not been decomposed, can be separated from the processed wafer.

The tape material may be any tape material that can be separated. In particular, a tape formed of silicone adhesive is preferable and for example, polyester film adhesive tapes No. 646S and No. 648 of TERAOKA SEISAKUSHO CO., LTD. are preferred.

In addition, when the tape material is separated by peeling, it is preferable to separate the tape material with the laminate heated. The heating temperature is preferably 30 to 60° C., more preferably 35 to 55° C. If the heated laminate is used, the adhesion power between the resin layer B and the wafer is low and thus, the separation by peeling can be performed more easily.

Step (h)

After the step (g), it is preferable to perform the step of removing the temporary adhesive layer that is left on the circuit non-formation surface of the separated wafer. On the circuit formation surface of the wafer that is separated in the step (g), the resin layer B may be left partially, and in this case, the resin layer B can be removed by, for example, cleaning the wafer.

In the step (h), a cleaner that dissolves the component of the resin layer B can be used; specifically, pentane, hexane, cyclohexane, decane, isononane, p-menthane, pinene, isododecane, limonene, or the like can be used. Any of these solvents can be used alone, or two or more kinds thereof can be used in combination. If it is difficult to remove, a base or an acid may be added to the solvent. Examples of the base include amines such as ethanol amine, diethanol amine, triethanol amine, triethyl amine, and ammonia, and ammonium salts such as tetramethyl ammonium hydrdoxide. Examples of the acid include organic acids such as acetate, oxalate, benzene sulfonate, and dodecyl benzene sulfonate. The additive may be contained by 0.01 to 10% by weight, preferably 0.1 to 5% by weight, and this is the concentration of the additive in the cleaning solution. To remove the residues more, the existing surfactant may be added. The cleaning method may be a method of cleaning with a paddle using the solution, a cleaning method using spraying, a method of immersion in a cleaning solution tank, or the like. The temperature is preferably 10 to 80° C., preferably 15 to 65° C., and if necessary, after the resin layer B is dissolved in the solution thereof, water cleaning or rinsing with alcohol is performed finally and dried, so that the thin wafer can be obtained.

As described above, the support body, the resin layer, and the substrate having the circuits on the surface are combined, the support body is separated, and the resin layer is further separated by tape peeling; thus, the thin wafer can be obtained finally.

Through the above-described process, the support body and the wafer can be bonded together easily, the film can be formed with uniform thickness on the substrate with a large level difference, the step of forming the TSV and the step of forming the lines on the back surface of the wafer can be performed properly, the resistance against the wafer thermal process such as CVD (chemical vapor deposition) is high, the wafer can be separated from the support body easily, the resin can be removed without contaminating the wafer, and the productivity of the thin wafer can be enhanced.

EXAMPLES

The present invention is described in more detail with reference to Preparation Examples, Examples, and Comparative Examples; however, the present invention is not limited to these Examples. Note that the weight-average molecular weight (Mw) is the measurement value in terms of polystyrene obtained by GPC using THF as the solvent.

Compounds (M-1) to (M-6) and an acid generator AG that are used in the following Examples are as below.

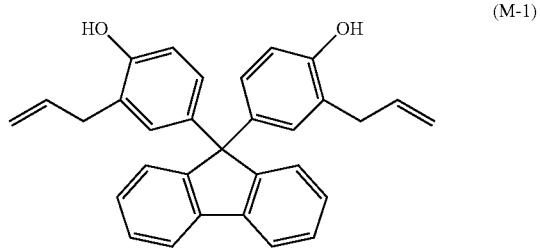

(M-1)

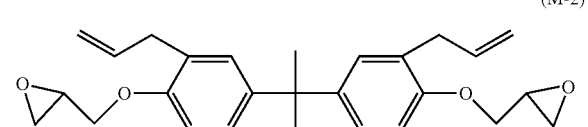

(M-2)

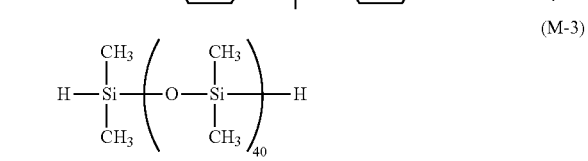

(M-3)

(M-4)

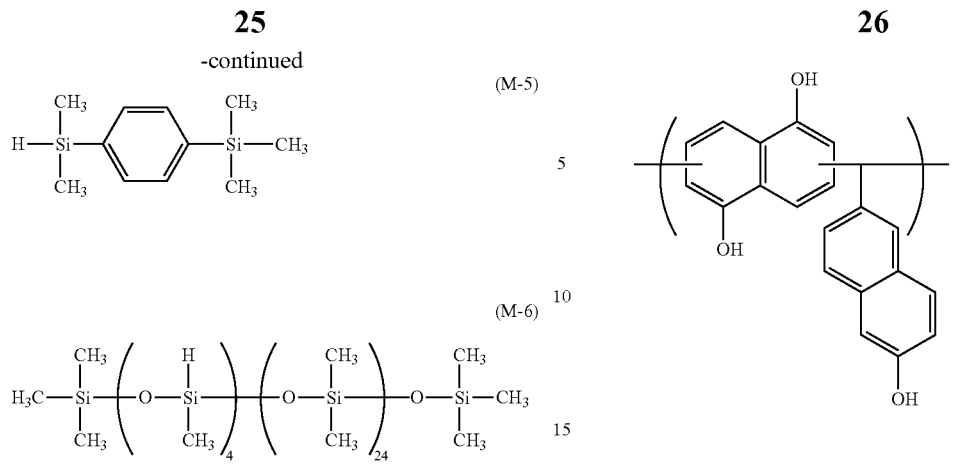

(M-5)

(M-6)

AG

[1] Preparation of Resin Compositions

Preparation Example 1

Into a 1,000-mL flask, 80 g (0.5.0 mol) of 1,5-dihydroxynaphthalene, 51.6 g (0.30 mol) of 2-hydroxy-6-naphthaldehyde, and 145 g of methyl cellosolve were added and while the mixture was stirred at 70° C., 20 g of a methyl cellosolve solution containing 20% by weight of paratoluene sulfonate was added to the mixture. With the temperature increased to 85° C., the mixture was stirred for 6 hours, and then the temperature was decreased to room temperature. After that, the mixture was diluted with 800 mL of ethyl acetate. After the mixture was transferred to a separatory funnel, the mixture was cleaned with 200 mL of deionized water repeatedly, so that the reaction catalyst and the metal impurities were removed. The resulting solution was concentrated under reduced pressure; then, 600 mL of ethyl acetate was added to the residue and the obtained mixture was added to 2,400 mL of hexane and the resin was precipitated. The precipitated resin was filtered and collected, and then dried under reduced pressure; thus, a resin A1 including a repeating unit represented by the following formula was obtained. The resin A1 has an Mw of 3,200 and a dispersion degree (Mw/Mn) of 2.44.

To 100 parts by weight of PGMEA containing 0.1% by weight of FC-4430 (3M), 20 parts by weight of the resin A1, 1 part by weight of the acid generator AG, and 4 parts by weight of NIKALAC Mw390 (Sanwa Chemical Co., Ltd.) as the crosslinker were dissolved, and the mixture was filtered through a filter formed of fluorine resin of 0.1 μm; thus, a resin composition A1 was obtained.

Preparation Example 2

To a 1,000-mL flask, 80 g (0.50 mol) of 1,5-dihydroxynaphthalene, 9.0 g (0.30 mol) of paraformaldehyde, and 145 g of methyl cellosolve were added and while the mixture was stirred at 70° C., 20 g of a methyl cellosolve solution containing 20% by weight of paratoluene sulfonate was added. With the temperature increased to 85° C., the mixture was stirred for 6 hours, and then the temperature was decreased to room temperature. After that, the mixture was diluted with 800 mL of ethyl acetate. After the mixture was transferred to a separatory funnel, the mixture was cleaned with 200 mL of deionized water repeatedly, so that the reaction catalyst and the metal impurities were removed. The resulting solution was concentrated under reduced pressure; then, 600 mL of ethyl acetate was added to the residue and the obtained mixture was added to 2,400 mL of hexane and the resin was precipitated. The precipitated resin was filtered and collected, and then dried under reduced pressure; thus, a resin A2 including a repeating unit represented by the following formula was obtained. The resin A2 has an Mw of 1,500 and an Mw/Mn of 2.20.

To 100 parts by weight of PGMEA containing 0.1% by weight of FC-4430 (3M), 20 parts by weight of the resin A2, 1 part by weight of the acid generator AG, and 4 parts by weight of NIKALAC Mw390 (Sanwa Chemical Co., Ltd.) as the crosslinker were dissolved, and the mixture was filtered through a filter formed of fluorine resin of 0.1 μm; thus, a resin composition A2 was obtained.

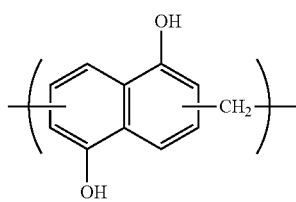

Preparation Example 3

To a 1,000-mL flask, 72 g (0.50 mol) of 1-hydroxynaphthalene, 51.6 g (0.30 mol) of 2-hydroxy-6-naphthaldehyde, and 145 g of methyl cellosolve were added and while the mixture was stirred at 70° C., 20 g of a methyl cellosolve solution containing 20% by weight of paratoluene sulfonate was added. With the temperature increased to 85° C., the mixture was stirred for 6 hours, and then the temperature was decreased to room temperature. After that, the mixture was diluted with 800 mL of ethyl acetate. After the mixture was transferred to a separatory funnel, the mixture was cleaned with 200 mL of deionized water repeatedly, so that the reaction catalyst and the metal impurities were removed. The resulting solution was concentrated under reduced pressure; then, 600 mL of ethyl acetate was added to the residue and the obtained mixture was added to 2,400 mL of hexane and the resin was precipitated. The precipitated resin was filtered and collected, and then dried under reduced pressure; thus, a resin A3 including a repeating unit represented by the following formula was obtained. The resin A3 has an Mw of 2,700 and an Mw/Mn of 2.61.

To 100 parts by weight of PGMEA containing 0.1% by weight of FC-4430 (3M), 20 parts by weight of the resin A3, 1 part by weight of the acid generator AG, and 4 parts by weight of NIKALAC Mw390 (Sanwa Chemical Co., Ltd.) as the crosslinker were dissolved, and the mixture was filtered through a filter formed of fluorine resin of 0.1 μm; thus, a resin composition A3 was obtained.

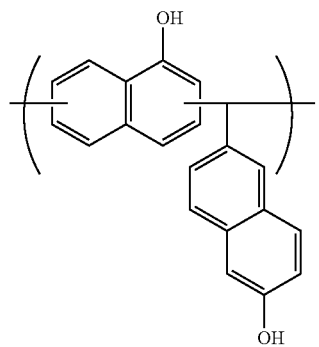

Preparation Example 4

Into a 5-L flask provided with a stirrer, a thermometer, a nitrogen substituting device, and a reflux condenser, 43.1 g of the compound (M-1), 90.8 g of the compound (M-3), 135 g of toluene, and 0.04 g of chloroplatinic acid were added and the temperature of the mixture was increased to 80° C. Then, 13.6 g of the compound (M-5) was dropped into the flask for one hour. In this process, the temperature in the flask increased to 85° C. After the dropping, the mixture was matured for another 2 hours at 80° C., and toluene was distilled away and then, 80 g of cyclohexanone was added; thus, a resin solution with a resin solid content concentration of 50% by weight including cyclohexanone as the solvent was obtained. The resin in the resin solution had an Mw of 50,000. Into 50 g of this resin solution, 7.5 g of epoxy crosslinker EOCN-1020 (Nippon Kayaku Co., Ltd.) as the crosslinker, 0.2 g of BSDM (bis(tert-butylsulfonyl)diazomethane (Wako Pure Chemical Corporation) as the hardening catalyst, and 0.1 g of tetrakis[methylene(3,5-di-t-butyl-4-hydroxyhydro-cinnamate)]methane (product name: ADEKA STAB AO-60) as the antioxidant were added, and the mixture was filtered through a membrane filter of 1 μm; thus, a resin composition B1 was obtained.

Preparation Example 5

Into a 5-L flask provided with a stirrer, a theimoineter, a nitrogen substituting device, and a reflux condenser, 84.1 g of the compound (M-2) and 250 g of toluene were added and dissolved. Then, 121.0 g of the compound (M-3) and 21.5 g of the compound (M-4) were added and the mixture was heated to 60° C. After that, 1 g of carbon carried platinum catalyst (5% by weight) was added and after it was confirmed that the internal reaction temperature increased to 65 to 67° C., the temperature was increased further to 90° C., and the mixture was matured for 3 hours. Next, after the mixture was cooled to room temperature, 250 g of methyl isobutyl ketone (MIBK) was added and this reaction solution was filtered through a filter with pressure, so that the platinum catalyst was removed. The solvent in this resin solution was distilled away under reduced pressure and 150 g of propylene glycol monomethyl ether acetate (PGMEA) was added and thus, the resin solution with a solid content concentration of 60% by weight including PGMEA as the solvent was obtained. The resin in the resin solution had an Mw of 45,000. Into 100 g of this resin solution, 9 g of tetrafunctional phenol compound TEP-TPA YUKIZAI CORPORATION) as the crosslinker, and 0.2 g of tetrahydrophthalic anhydride (RIKACID HH-A, New Japan Chemical Co., Ltd.) as the hardening catalyst were added, and the mixture was filtered through a membrane filter of 1 μm; thus, a resin composition B2 was obtained.

Preparation Example 6

Into a 5-L flask provided with a stirrer, a thermometer, a nitrogen substituting device, and a reflux condenser, 84.1 g of the compound (M-2) and 170 g of toluene were added and dissolved. Then, 60.5 g of the compound (M-3) and 24.2 g of the compound (M-4) were added and the mixture was heated to 60° C. After that, 1 g of carbon carried platinum catalyst (5% by weight) was added and after it was confirmed that the internal reaction temperature increased to 65 to 67° C., the temperature was increased further to 90° C., and the mixture was matured for 3 hours. Next, after the mixture was cooled to room temperature, 170 g of MIBK was added and this reaction solution was filtered through a filter with pressure, so that the platinum catalyst was removed. The solvent in this resin solution was distilled away under reduced pressure and 110 g of PGMEA was added and thus, the resin solution with a solid content concentration of 60% by weight including PGMEA as the solvent was obtained. The resin in the resin solution had an Mw of 42,000. Into 100 g of this resin solution, 9 g of tetrafunctional phenol compound TEP-TPA YUKIZAI CORPORATION) as the crosslinker, and 0.2 g of tetrahydrophthalic anhydride (RIKACID HH-A, New Japan Chemical Co., Ltd.) as the hardening catalyst were added, and the mixture was filtered through a membrane filter of 1 μm; thus, a resin composition B3 was obtained.

Preparation Example 7

Into a 5-L flask provided with a stirrer, a thermometer, a nitrogen substituting device, and a reflux condenser, 84.1 g of the compound (M-2) and 150 g of toluene were added and dissolved. Then, 30.3 g of the compound (M-3) and 25.5 g of the compound (M-4) were added and the mixture was heated to 60° C. After that, 1 g of carbon carried platinum catalyst (5% by weight) was added and after it was confirmed that the internal reaction temperature increased to 65 to 67° C., the temperature was increased further to 90° C., and the mixture was matured for 3 hours. Next, after the mixture was cooled to room temperature, 150 g of MIBK was added and this reaction solution was filtered through a filter with pressure, so that the platinum catalyst was removed. The solvent in this resin solution was distilled away under reduced pressure and 90 g of PGMEA was added and thus, the resin solution with a solid content concentration of 60% by weight including PGMEA as the solvent was obtained. The resin in the resin solution had an Mw of 35,000. Into 100 g of this resin solution, 9 g of tetrafunctional phenol compound TEP-TPA (ASAHI YUKIZAI CORPORATION) as the crosslinker, and 0.2 g of tetrahydrophthalic anhydride (RIKACID HH-A, New Japan Chemical Co., Ltd.) as the hardening catalyst were added, and the mixture was filtered through a membrane filter of 1 μm; thus, a resin composition B4 was obtained.

Preparation Example 8

Into a 5-L flask provided with a stirrer, a thermometer, a nitrogen substituting device, and a reflux condenser, 84.1 g of the compound (M-2) and 120 g of toluene were added and dissolved. Then, 9.1 g of the compound (M-3) and 26.5 g of the compound (M-4) were added and the mixture was heated to 60° C. After that, 1 g of carbon carried platinum catalyst (5% by weight) was added and after it was confirmed that the internal reaction temperature increased to 65 to 67° C., the temperature was increased further to 90° C., and the mixture was matured for 3 hours. Next, after the mixture was cooled to room temperature, 120 g of MIBK was added and this reaction solution was filtered through a filter with pressure, so that the platinum catalyst was removed. The solvent in this resin solution was distilled away under reduced pressure and 75 g of PGMEA was added and thus, the resin solution with a solid content concentration of 60% by weight including PGMEA as the solvent was obtained. The resin in the resin solution had an Mw of 28,000. Into 100 g of this resin solution, 9 g of tetrafunctional phenol compound TEP-TPA (ASAHI YUKIZAI CORPORATION) as the crosslinker, and 0.2 g of tetrahydrophthalic anhydride (RIKACID HH-A, New Japan Chemical Co., Ltd.) as the hardening catalyst were added, and the mixture was filtered through a membrane filter of 1 μM; thus, a resin composition B5 was obtained.

Preparation Example 9

Into a 5-L flask provided with a stirrer, a thermometer, a nitrogen substituting device, and a reflux condenser, 84.1 g of the compound (M-2) and 110 g of toluene were added and dissolved. Then, 26.9 g of the compound (M-4) was added and the mixture was heated to 60° C. After that, 1 g of carbon carried platinum catalyst (5% by weight) was added and after it was confirmed that the internal reaction temperature increased to 65 to 67° C., the temperature was increased further to 90° C., and the mixture was matured for 3 hours. Next, after the mixture was cooled to room temperature, 110 g of MIBK was added and this reaction solution was filtered through a filter with pressure, so that the platinum catalyst was removed. The solvent in this resin solution was distilled away under reduced pressure and 70 g of PGMEA was added and thus, the resin solution with a solid content concentration of 60% by weight including PGMEA as the solvent was obtained. The resin in the resin solution had an Mw of 25000. Into 100 g of this resin solution, 9 g of tetrafunctional phenol compound TEP-TPA (ASAHI YUKIZAI CORPORATION) as the crosslinker, and 0.2 g of tetrahydrophthalic anhydride (RIKACID HH-A, New Japan Chemical Co., Ltd.) as the hardening catalyst were added, and the mixture was filtered through a membrane filter of 1 μm; thus, a resin composition B6 was obtained.

Preparation Example 10

Into a 5-L flask provided with a stirrer, a thermometer, a nitrogen substituting device, and a reflux condenser, 28.0 g of the compound (M-2) and 130 g of toluene were added and dissolved. Then, 100.9 g of the compound (M-3) and 4.5 g of the compound (M-4) were added and the mixture was heated to 60° C. After that, 1 g of carbon carried platinum catalyst (5% by weight) was added and after it was confirmed that the internal reaction temperature increased to 65 to 67° C., the temperature was increased further to 90° C. and the mixture was matured for 3 hours. Next, after the mixture was cooled to room temperature, 130 g of MIBK was added and this reaction solution was filtered through a filter with pressure, so that the platinum catalyst was removed. The solvent in this resin solution was distilled away under reduced pressure and 80 g of PGMEA was added and thus, the resin solution with a solid content concentration of 60% by weight including PGMEA as the solvent was obtained. The resin in the resin solution had an Mw of 52,000. Into 100 g of this resin solution, 9 g of tetrafunctional phenol compound TEP-TPA (ASAHI YUKIZAI CORPORATION) as the crosslinker, and 0.2 g of tetrahydrophthalic anhydride (RIKACID HH-A, New Japan Chemical Co., Ltd.) as the hardening catalyst were added, and the mixture was filtered through a membrane filter of 1 μm; thus, a resin composition B7 was obtained.

Preparation Example 11

Into 150 g of mesitylene, 25 g of hydrogenated polystyrene thermoplastic resin SEPTON 4033 (KURARAY CO., LTD., polystyrene-poly(ethylene/propylene)block-polystyrene copolymer, containing styrene by 30% by weight) and 25 g of hydrogenated polystyrene thermoplastic resin SEPTON 8076 (KURARAY CO., LTD., polystyrene-poly(ethylene/butylene)block-polystyrene copolymer, containing styrene by 30% by weight) were dissolved; thus, a mesitylene solution containing SEPTON 4033/8076 by 25% by weight was obtained. The obtained solution was filtered through a membrane filter of 0.2 μm; thus, a resin composition B8 was obtained.

Preparation Example 12

To a solution containing 200 parts by weight of toluene and 100 parts by weight of polydimethyl siloxane with a number-average molecular weight (Mn) of 30,000 having 2.5 mol % of vinyl groups at a molecular side chain, 40 parts by weight of the compound (M-6) and 0.7 parts by weight of ethynylcyclohexanol were added and mixed. In addition, 0.2 parts by weight of platinum catalyst CAT-PL-5 (Shin-Etsu Chemical Co., Ltd.) was added and the mixture was filtered through a membrane filter of 0.2 μm; thus, a thermosetting silicone resin composition B9 was obtained. In the resin composition B9, the content ratio of organohydrogenpolysiloxane containing the Si—H group to the alkenyl group in the organopolysiloxane with the alkenyl group was 1.1 in molar ratio.

[2] Production and Evaluation of Thin Wafer

Examples 1 to 10, Comparative Examples 1 to 2

On a glass plate with a diameter of 200 mm (thickness: 500 μm), the resin compositions A1, A2, or A3 was applied by spin coating and heated on a hot plate at 180° C. for 2 minutes and then at 250° C. for 5 minutes; thus, the films of the materials for the resin layer A were formed with the thicknesses shown in Tables 1 and 2.

In addition, a silicon wafer with a diameter of 200 mm (thickness: 725 µm) on which a copper post with a height of 10 µm and a diameter of 40 µm was formed on an entire surface was provided. On the copper post surface or the resin layer A, the resin composition B1, B2, B3, B4, B5, B6, B7, B8, or B9 was applied by spin coating and then, the resin compositions B1 to B7 were heated on the hot plate at 150° C. for 5 minutes, the resin composition B8 was heated on the hot plate at 150° C. for 5 minutes, and the resin composition B9 was not heated; thus, the resin layers B were formed with the thicknesses shown in Tables 1 and 2.

The resin surfaces or the resin layer B and the copper post surface of the wafer were bonded together in accordance with the combination of the glass plate-the resin layer A and the resin layer B-the wafer, or the combination of the glass plate-the resin layer A-the resin layer B and the wafer in the vacuum bonding device (EVG520IS, EVG) under a reduced-pressure condition of 1 Pa or less and the conditions shown in Tables 1 and 2. Thus, the wafer laminates were produced.

After that, these bonded substrates were tested as shown below. The results are shown in Tables 1 and 2. The evaluations were performed in accordance with the following procedure.

(1) Adhesion Test

The wafers with a diameter of 200 mm were bonded together with the wafer bonding system EVG520IS of EVG. The bonding temperature was the values shown in Tables 1 and 2, the pressure in the chamber in the bonding was 1 Pa or less, and the load was 5 kN in Examples 1 to 8 and Comparative Examples 1 and 2, 20 kN in Example 9, and 3 kN in Example 10. After the bonding, the temperature was decreased to room temperature and the bonded state at the interface was observed with eyes and an optical microscope. The wafer free of abnormalities such as bubbles at the interface was evaluated good and shown as "◯", and the wafer with the abnormalities was evaluated poor and shown as "x".

(2) Test of Resistance Against Back Surface Grinding

The back surface of the silicon wafer was ground using a diamond wheel in the grinder (DAG810, DISCO). After the wafer was ground until the final substrate thickness became 50 µm, the wafer was observed with the optical microscope (magnification 100) to check the abnormality such as crack or separation. The wafer free of abnormalities was evaluated good and shown as "◯", and the wafer with the abnormalities was evaluated poor and shown as "x".

(3) Test of Resistance in CVD

The laminate after the back surface of the silicon wafer was ground was introduced into the CVD apparatus and a $SiO_2$ film with a thickness of 1 µm or 2 µm was formed in the experiment; the occurrence of the abnormality in the external appearance in the experiment was examined. The laminate including the $SiO_2$ film with a thickness of 2 µm that was free of the abnormality in the external appearance was evaluated good and shown as "◯", the laminate including the $SiO_2$ film with a thickness up to 1 µm that was free of the abnormality was shown as "Δ", and the laminate including the $SiO_2$ film with a thickness of 1 µm that had an abnormality in the external appearance such as a void, wafer swelling, or a wafer damage was evaluated poor and was shown as "x". The test of resistance in CVD was performed under the following condition:

Name of device: plasma CVD PD270STL (Samco Inc.) RF 500 W, internal pressure 40 Pa
TEOS (tetraethyl orthosilicate): $O_2$=20 sccm: 680 sccm (4) Test of Separability of Support Body The separability of the support body was evaluated by the following method. First, on the wafer side of the wafer laminate after the test of the resistance in CVD, in which the wafer was thinned to 50 µm, a dicing tape was pasted using a dicing frame and this dicing tape surface was set to a suction plate by vacuum section. After that, the entire surface was irradiated with a laser with 355 nm from the support body side. In Comparative Example 2, the laser irradiation was not performed and the glass substrate was separated by lifting up a point of the glass with tweezers. If the glass substrate was separated without breaking the support body or the wafer with a thickness of 50 µm, it is shown by "◯", and if the abnormality such as breakage occurred, it is evaluated poor and shown by "x".

(5) Test of Peel Separability

The peel separability of the resin layers B resulting from the resin compositions B1 to B9 was evaluated by the following method. First, a peeling tape was pasted to a surface of the adhesive layer in the wafer laminate after the test of the separability of the support body. After that, the peeling tape was lifted up to separate the adhesive layer and the wafer at the interface. Note that the test of the separability was performed at room temperature (23° C.) in Examples 1 to 5, 8, and 10 and Comparative Examples 1 and 2, on a stage heated at 40° C. in Examples 7 and 9, and both at room temperature (23° C.) and on the stage heated at 40° C. in Example 6. Here, the wafer with a thickness of 50 µm that was separated without a damage on the wafer and without the residue is shown by "◯", the wafer without a damage but with the residue is shown by "Δ", and the wafer with the abnormality such as a damage or residue is evaluated poor and shown by "x".

(6) Test of Peel-Separating Power

On the silicon wafer, each of the resin compositions B1 to B9 was applied by spin coating, heated on a hot plate at 150° C. for 5 minutes and then heated for another hour at 180° C. Thus, the corresponding adhesive layers were hardened so as to have the film thickness shown in Tables 1 and 2. Subsequently, five polyimide tapes, each having a length of 150 mm and a width of 25 mm were pasted on the adhesive layer of the wafer and the adhesive layer in the part where the tape was not pasted was removed. The tape was separated from one end at 180° by 120 mm at a speed of 300 mm/min using AUTOGRAPH (AG-1), SHIMADZU CORPORATION, and the average of the power applied in this separation (120 mm strokes×5 times) was regarded as the separating power for the adhesive layer. Note that the test of the separating power was performed at room temperature (23° C.) in Examples 1 to 5, 8, and 10 and Comparative Examples 1 and 2, on the stage heated at 40° C. in Examples 7 and 9, and both at room temperature (23° C.) and on the stage heated at 40° C. in Example 6.

(7) Test of Transmissivity

On a glass substrate with a thickness of 500 µm, each of the resin compositions A1, A2, and A3 was applied with a thickness of 0.3 µm by spin coating, heated on a hot plate at 180° C. for 2 minutes and then heated at 250° C. for 5 minutes so that the compositions were hardened. Then, the transmissivity (wavelength 355 nm) was measured using the spectrophotometer (U-4100, Hitachi High-Tech Science Corporation). Here, the product with a transmissivity of 20% or less is evaluated good and shown by "◯", and the product with a transmissivity of more than 20% is evaluated poor and shown by "x".

The transmissivity of the resin layers A formed on the support substrate using the resin compositions A1, A2, and A3 was measured. It was confirmed that the absorption maximum wavelengths were in the range of 300 to 500 nm.

(8) Measurement of Elastic Modulus

The resin compositions B1 to B9 were hardened by heating at 180° C. for 10 minutes, so that a measurement sheet having a rectangular shape with a thickness of 0.5 mm and a size of 30 mm×10 mm was obtained. The resin composition B8 was also heated at 180° C. for 10 minutes, so that a measurement sheet having a rectangular shape with a thickness of 0.5 mm and a size of 30 mm×10 mm was obtained. Using the produced measurement sheet, the measurement was performed under a condition of a frequency of 1 Hz and a temperature rising speed of 3° C./min in the temperature range of 0 to 300° C. with the use of the dynamic mechanical analyzer (DIVIA7100, Hitachi High-Tech Science Corporation) and the value obtained at 25° C. was used as the elastic modulus (E').

(9) Measurement of Tensile Breaking Strength

The resin compositions B1 to B9 were hardened by heating at 180° C. for 10 minutes, so that a dumbbell-type sheet with a shape No. 5 was obtained from the sheet having a rectangular shape with a thickness of 0.4 mm and a size of 200 mm×40 mm. The resin composition B8 was also heated at 180° C. for 10 minutes, so that a dumbbell-type sheet with a shape No. 5 was obtained from the sheet having a rectangular shape with a thickness of 0.4 mm and a size of 200 mm×40 mm. With the produced measurement sheet, the measurement was performed using a tensile tester (V10D, Toyo Seiki Seisakusho, Ltd.) with a tensile speed of 50 mm/min, and the strength at which the measurement sheet was broken was used as the breaking strength (MPa).

TABLE 2

| | Comparative Example | |
|---|---|---|
| | 1 | 2 |
| Resin layer A | — | A1 |
| Thickness of resin layer A (μm) | — | 0.3 |
| Transmissivity of resin layer A | — | ○ (7%) |
| Resin layer B | B1 | B1 |
| Film-formation direction of resin layer B (a: On wafer) (b: On resin layer A) | a | a |
| Thickness of resin layer B (μm) | 60 | 60 |
| Siloxane content of resin layer B (% by weight) | 62 | 62 |
| Peel-separating power of resin layer B (gf, 23° C.) | 5 | 5 |
| Peel-separating power of resin layer B (gf, 40° C.) | — | — |
| E' of resin layer B (MPa) | 21 | 21 |
| Tensile breaking strength of resin layer B (MPa) | 8 | 8 |
| Bonding temperature (° C.) | 110 | 110 |
| Adhesion    Eyes | ○ | ○ |
|             Optical microscope | ○ | ○ |
| Resistance against back surface grinding | ○ | ○ |
| Resistance in CVD | ○ | ○ |
| Separability of support body | X | X (Mechanical separation) |
| Peel separability | — | — |

The above results indicate that the temporary adhesion, the separation of the support body, and the peel separation are easy in Examples 1 to 10. On the other hand, in Comparative Example 1, the support body after the laser irradiation was not separated and was broken, and in Comparative Example 2, the support body was not separated and was broken. In Examples 1 to 10, the measurement of the wafer surface after the separation by the use of the SEM-

TABLE 1

| | Example | | | | | | | | | |
|---|---|---|---|---|---|---|---|---|---|---|
| | 1 | 2 | 3 | 4 | 5 | 6 | 7 | 8 | 9 | 10 |
| Resin layer A | A1 | A2 | A3 | A1 | A1 | A3 | A1 | A1 | A1 | A1 |
| Thickness of resin layer A (μm) | 0.3 | 0.3 | 0.3 | 0.3 | 0.3 | 0.3 | 0.3 | 0.3 | 0.3 | 0.3 |
| Transmissivity of resin layer A | ○ (7%) | ○ (12%) | ○ (9%) | ○ (7%) | ○ (7%) | ○ (9%) | ○ (7%) | ○ (7%) | ○ (7%) | ○ (7%) |
| Resin layer B | B1 | B2 | B3 | B4 | B4 | B5 | B6 | B7 | B8 | B9 |
| Film-formation direction of resin layer B (a: On wafer) (b: On resin layer A) | a | a | a | a | b | a | a | a | a | a |
| Thickness of resin layer B (μm) | 60 | 60 | 50 | 60 | 60 | 60 | 60 | 60 | 30 | 50 |
| Siloxane content of resin layer B (% by weight) | 62 | 63 | 50 | 40 | 40 | 30 | 24 | 79 | — | 100 |
| Peel-separating power of resin layer B (gf, 23° C.) | 5 | 10 | 20 | 50 | 50 | 80 | >100 | <1 | — | 2 |
| Peel-separating power of resin layer B (gf, 40° C.) | — | — | — | — | — | 60 | 75 | — | 40 | — |
| E' of resin layer B (MPa) | 21 | 103 | 260 | 420 | 420 | 630 | 1,100 | 12 | 23 | 44 |
| Tensile breaking strength of resin layer B (MPa) | 8 | 7 | 12 | 18 | 18 | 31 | 55 | <1 | 27 | <1 |
| Bonding temperature (° C.) | 110 | 120 | 130 | 140 | 140 | 150 | 170 | 100 | 220 | 60 |
| Adhesion    Eyes | ○ | ○ | ○ | ○ | ○ | ○ | ○ | ○ | ○ | ○ |
|             Optical microscope | ○ | ○ | ○ | ○ | ○ | ○ | ○ | ○ | ○ | ○ |
| Resistance against back surface grinding | ○ | ○ | ○ | ○ | ○ | ○ | ○ | ○ | ○ | ○ |
| Resistance in CVD | ○ | ○ | ○ | ○ | ○ | ○ | ○ | △ | ○ | ○ |
| Separability of support body | ○ | ○ | ○ | ○ | ○ | ○ | ○ | ○ | ○ | ○ |
| Peel separability | ○ | ○ | ○ | ○ | ○ | △ (23° C.) ○ (40° C.) | ○ (40° C.) | ○ | ○ (40° C.) | ○ |

The invention claimed is:

1. A method for producing a thin wafer, comprising:
separating a support body from a wafer laminate by irradiating the wafer laminate with light from the side of the support body of the wafer laminate; and
after the separating, removing a resin layer remaining on the wafer from the wafer by peeling;
wherein the wafer laminate includes a support body, an adhesive layer formed on the support body, and a wafer stacked with a surface thereof including a circuit plane facing the adhesive layer; and
the adhesive layer includes only a resin layer A with a light-blocking property, and a resin layer B including a thermosetting silicone resin or a non-silicone thermoplastic resin in this order from the side of the support body,
wherein the resin layer A with a light-blocking property has a transmissivity of 20% or less at a wavelength of 355 nm and an absorption maximum wavelength of 300 to 500 nm.

2. The method for producing a thin wafer according to claim 1, wherein the laminate is exposed to a temperature of 30 to 60° C. when the resin layer B is separated by peeling from the wafer.

3. The method for producing a thin wafer according to claim 1, wherein the resin layer A includes a hardened product of a resin composition A containing a resin A including a repeating unit represented by the following formula (1):

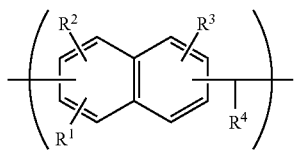

wherein $R^1$ to $R^3$ independently represent a hydrogen atom, a hydroxy group, or a monovalent organic group of 1 to 20 carbon atoms, at least one of $R^1$ to $R^3$ is a hydroxy group, and $R^4$ represents a hydrogen atom or a monovalent organic group of 1 to 30 carbon atoms that may have a substituent.

4. The method for producing a thin wafer according to claim 3, wherein the resin composition A further includes a crosslinker.

5. The method for producing a thin wafer according to claim 3, wherein the resin composition A further includes an acid generator.

6. The method for producing a thin wafer according to claim 3, wherein the resin composition A further includes an organic solvent.

7. The method for producing a thin wafer according to claim 1, wherein the resin layer A has a thickness of 0.1 to 50 μm.

8. The method for producing a thin wafer according to claim 1, wherein
the resin layer B includes a resin including a siloxane skeleton and an epoxy group, and
the resin including the siloxane skeleton and the epoxy group includes a repeating unit represented by the following formula (2) and optionally a repeating unit represented by the following formula (3):

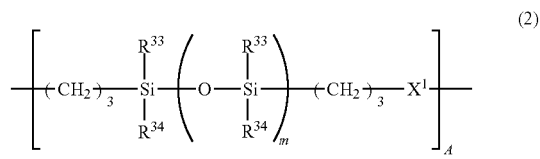

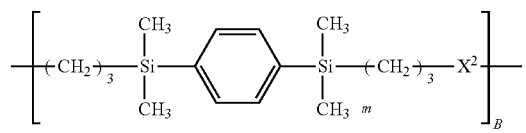

wherein $R^{31}$ to $R^{34}$ independently represent a monovalent hydrocarbon group of 1 to 8 carbon atoms, m represents an integer of 1 to 100, A and B are numbers satisfying $0<A\leq 1$, $0\leq B<1$, and $A+B=1$, and $X^1$ and $X^2$ each represent a bivalent organic group represented by the following formula (4):

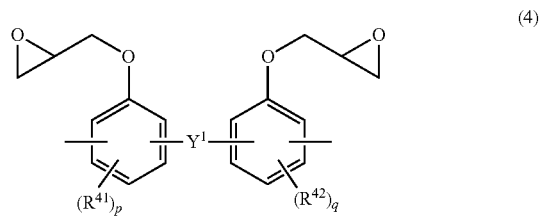

wherein $Y^1$ represents a single bond, a methylene group, a propane-2,2-diyl group, a 1,1,1,3,3,3-hexafluoropropane-2,2-diyl group or a fluorene-9,9-diyl group, $R^{41}$ and $R^{42}$ independently represent an alkyl group or an alkoxy group of 1 to 4 carbon atoms, and p and q independently represent 0, 1, or 2.

9. The method for producing a thin wafer according to claim 1, wherein
the resin layer B includes a non-silicone thermoplastic resin, and
the non-silicone thermoplastic resin is at least one kind selected from the group consisting of polyolefin base thermoplastic elastomer, polybutadiene base thermoplastic elastomer, polystyrene base thermoplastic elastomer, polystyrene-butadiene base thermoplastic elastomer, polystyrene-olefin base thermoplastic elastomer, and those elastomers that have been hydrogenated.

* * * * *